(12) United States Patent
Okumura et al.

(10) Patent No.: US 10,727,318 B2
(45) Date of Patent: Jul. 28, 2020

(54) SEMICONDUCTOR DEVICE VDMOS HAVING A GATE INSULATING FILM HAVING A HIGH DIELECTRIC CONSTANT PORTION CONTACTING THE DRIFT REGION FOR RELAXING AN ELECTRIC FIELD GENERATED IN THE GATE INSULATING FILM

(71) Applicant: ROHM CO., LTD., Kyoto (JP)

(72) Inventors: Keiji Okumura, Kyoto (JP); Mineo Miura, Kyoto (JP); Yuki Nakano, Kyoto (JP); Noriaki Kawamoto, Kyoto (JP); Hidetoshi Abe, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/261,830

(22) Filed: Sep. 9, 2016

(65) Prior Publication Data

US 2017/0092743 A1   Mar. 30, 2017

Related U.S. Application Data

(63) Continuation of application No. 13/635,312, filed as application No. PCT/JP2011/058058 on Mar. 30, 2011, now abandoned.

(30) Foreign Application Priority Data

Mar. 30, 2010  (JP) ................................ 2010-078280

(51) Int. Cl.
  *H01L 29/78*   (2006.01)
  *H01L 29/66*   (2006.01)
  (Continued)

(52) U.S. Cl.
  CPC .... *H01L 29/66734* (2013.01); *H01L 21/0254* (2013.01); *H01L 21/02164* (2013.01);
  (Continued)

(58) Field of Classification Search
  CPC ............ H01L 29/0696; H01L 29/0852; H01L 29/1095; H01L 29/66053; H01L 29/66674;
  (Continued)

(56) References Cited

U.S. PATENT DOCUMENTS 5,404,040 A    4/1995  Hshieh et al.
5,510,281 A  * 4/1996  Ghezzo ............... H01L 29/1608
                                                      257/E21.066

(Continued)

FOREIGN PATENT DOCUMENTS

JP      237777 A     2/1990
JP      2-82580      3/1990
(Continued)

OTHER PUBLICATIONS

European Search Report dated Oct. 16, 2015.
(Continued)

*Primary Examiner* — Anh D Mai
(74) *Attorney, Agent, or Firm* — Gregory M. Howison

(57) ABSTRACT

A method for producing a semiconductor power device, includes forming a gate trench from a surface of a semiconductor layer toward an inside thereof. A first insulation film is formed on an inner surface of the gate trench. The method also includes removing a part on a bottom surface of the gate trench in the first insulation film. A second insulation film having a dielectric constant higher than $SiO_2$ is formed in such a way as to cover the bottom surface of the gate trench exposed by removing the first insulation film.

11 Claims, 38 Drawing Sheets

(51) Int. Cl.
  *H01L 21/04* (2006.01)
  *H01L 29/06* (2006.01)
  *H01L 29/10* (2006.01)
  *H01L 29/51* (2006.01)
  *H01L 29/423* (2006.01)
  *H01L 29/08* (2006.01)
  *H01L 21/02* (2006.01)
  *H01L 21/311* (2006.01)
  *H01L 29/16* (2006.01)
  *H01L 29/45* (2006.01)

(52) U.S. Cl.
  CPC .. *H01L 21/02271* (2013.01); *H01L 21/02529* (2013.01); *H01L 21/0465* (2013.01); *H01L 21/31111* (2013.01); *H01L 29/0615* (2013.01); *H01L 29/0619* (2013.01); *H01L 29/0657* (2013.01); *H01L 29/0696* (2013.01); *H01L 29/0886* (2013.01); *H01L 29/1095* (2013.01); *H01L 29/4236* (2013.01); *H01L 29/4238* (2013.01); *H01L 29/42368* (2013.01); *H01L 29/42376* (2013.01); *H01L 29/512* (2013.01); *H01L 29/517* (2013.01); *H01L 29/518* (2013.01); *H01L 29/66068* (2013.01); *H01L 29/66719* (2013.01); *H01L 29/7802* (2013.01); *H01L 29/7811* (2013.01); *H01L 29/7813* (2013.01); *H01L 29/7827* (2013.01); *H01L 29/1608* (2013.01); *H01L 29/45* (2013.01); *H01L 29/513* (2013.01)

(58) Field of Classification Search
  CPC .......... H01L 29/66712; H01L 29/7802; H01L 29/66719; H01L 29/7827
  See application file for complete search history.

(56) References Cited

U.S. PATENT DOCUMENTS

| | | | |
|---|---|---|---|
| 5,621,234 A | | 4/1997 | Kato |
| 5,631,177 A | * | 5/1997 | Zambrano ....... H01L 21/823456 438/138 |
| 5,798,554 A | | 8/1998 | Grimaldi et al. |
| 5,907,169 A | | 5/1999 | Hshieh et al. |
| 6,709,930 B2 | * | 3/2004 | Chan ................. H01L 29/0634 257/E29.04 |
| 6,709,934 B2 | * | 3/2004 | Lee ................. H01L 21/28194 257/206 |
| 6,977,414 B2 | | 12/2005 | Nakamura et al. |
| 7,871,880 B2 | * | 1/2011 | Frisina ............... H01L 29/0634 438/232 |
| 9,184,286 B2 | | 11/2015 | Nakano |
| 10,510,844 B2 | * | 12/2019 | Noguchi ................ H01L 29/12 |
| 2002/0121661 A1 | * | 9/2002 | Nakamura ........ H01L 21/28185 257/328 |
| 2002/0140042 A1 | * | 10/2002 | Stout .................. H01L 21/2815 257/401 |
| 2003/0042549 A1 | | 3/2003 | Fujihira et al. |
| 2003/0107041 A1 | * | 6/2003 | Tanimoto .......... H01L 29/66068 257/77 |
| 2003/0201456 A1 | | 10/2003 | Saitoh et al. |
| 2004/0079989 A1 | * | 4/2004 | Kaneko ................ H01L 29/165 257/328 |
| 2004/0108547 A1 | * | 6/2004 | Venkatraman ...... H01L 29/7802 257/335 |
| 2005/0230686 A1 | | 10/2005 | Kojima et al. |
| 2005/0269648 A1 | | 12/2005 | Basceri et al. |
| 2007/0132012 A1 | | 6/2007 | Saito |
| 2007/0281173 A1 | | 12/2007 | Kojima et al. |
| 2008/0258211 A1 | | 10/2008 | Sugi et al. |
| 2009/0096020 A1 | | 4/2009 | Yamanobe |
| 2010/0193799 A1 | * | 8/2010 | Nakano ............... H01L 29/1608 257/77 |
| 2011/0095305 A1 | | 4/2011 | Yamashita et al. |
| 2014/0124851 A1 | * | 5/2014 | Gamerith .......... H01L 29/66712 257/329 |
| 2015/0380541 A1 | * | 12/2015 | Arai .................... H01L 29/7802 257/77 |

FOREIGN PATENT DOCUMENTS

| | | |
|---|---|---|
| JP | 04132264 A | 5/1992 |
| JP | H05-102487 A | 4/1993 |
| JP | 7-78978 A | 3/1995 |
| JP | 7-231088 A | 8/1995 |
| JP | 2000-106428 A | 4/2000 |
| JP | 2002280554 A | 9/2002 |
| JP | 2002-368215 A | 12/2002 |
| JP | 2003174164 A | 6/2003 |
| JP | 2003-347548 A | 12/2003 |
| JP | 2004-022693 A | 1/2004 |
| JP | 2005-136166 A | 5/2005 |
| JP | 2005-191241 A | 7/2005 |
| JP | 2005-310886 A | 11/2005 |
| JP | 2006-019608 A | 1/2006 |
| JP | 2007150142 A | 6/2007 |
| JP | 2009-032919 A | 2/2009 |
| JP | 2009-099714 A | 5/2009 |
| WO | WO 2004/036655 * 4/2004 ......... H01L 29/7802 |
| WO | WO-2010/021146 A1 | 2/2010 |

OTHER PUBLICATIONS

European Patent Office, Extended European Search Report for related application EP 19216772.4, Roberta Lantier; dated Apr. 6, 2020; 9 pages.

* cited by examiner

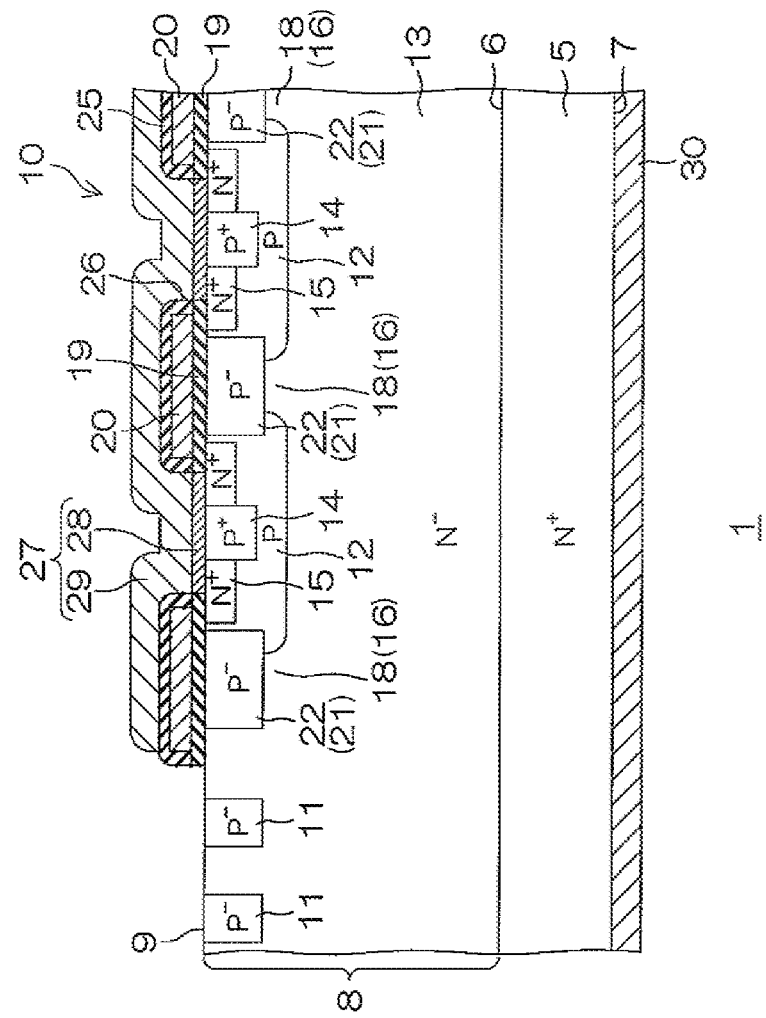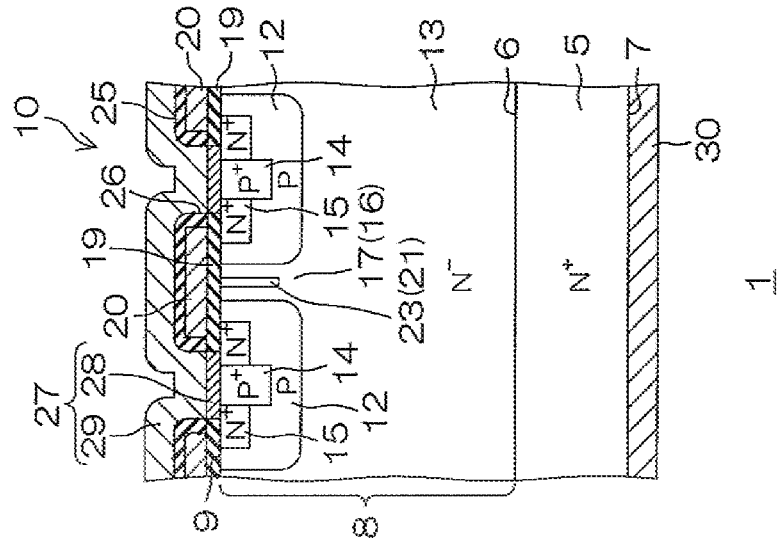

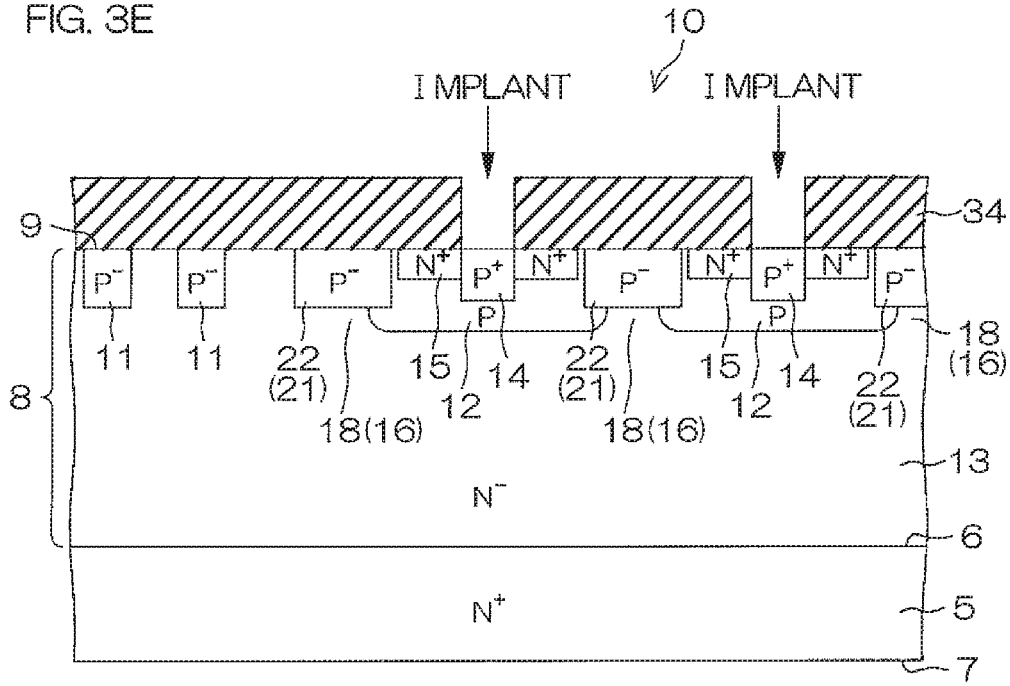
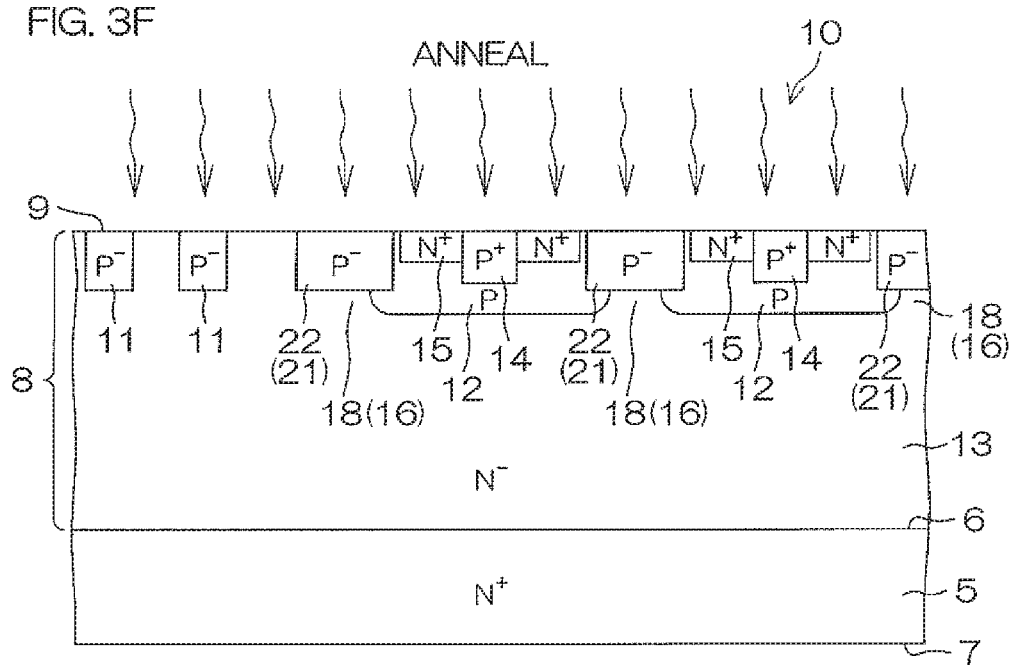

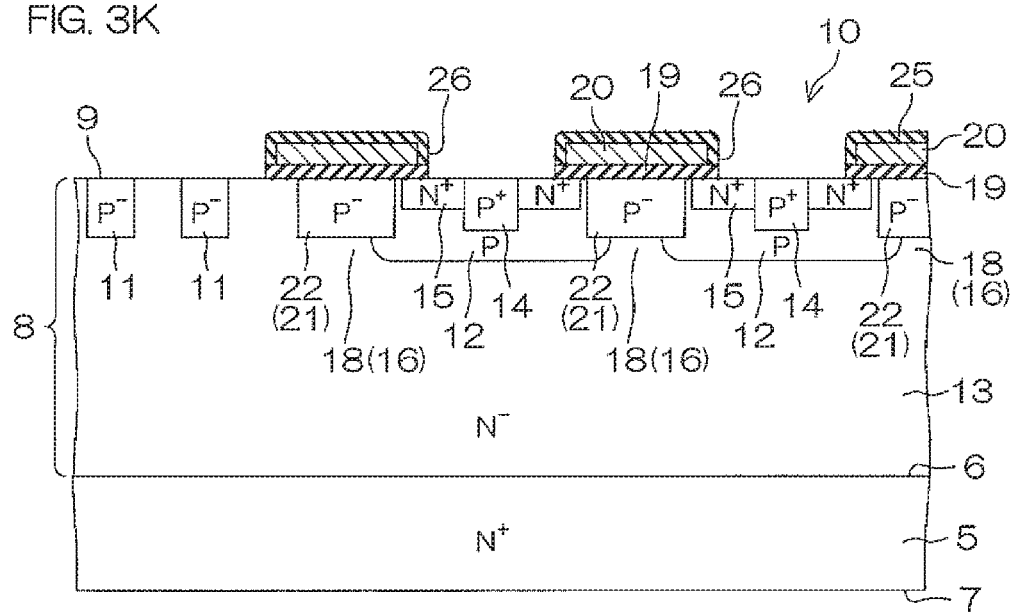

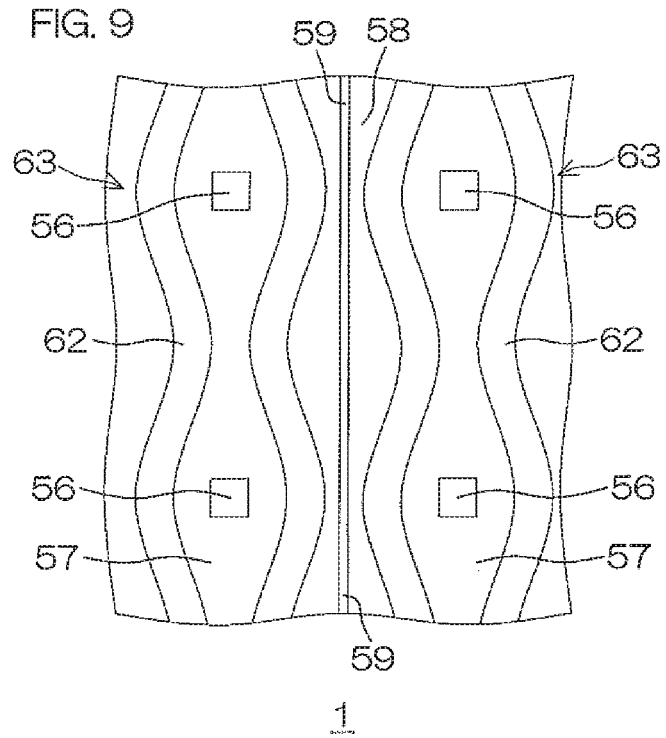
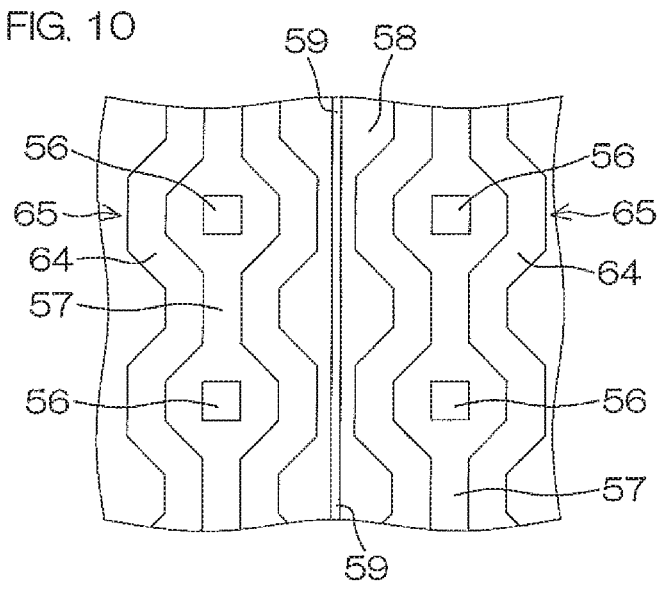

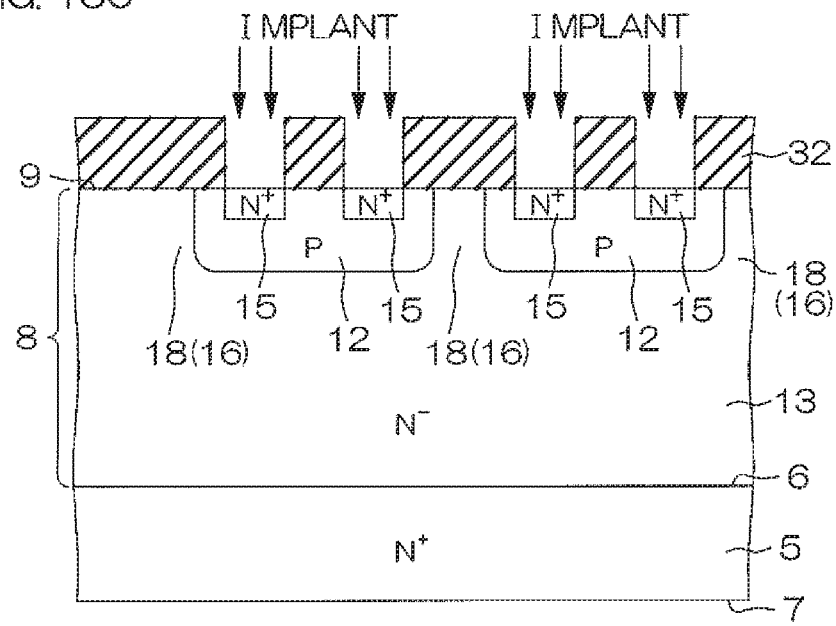
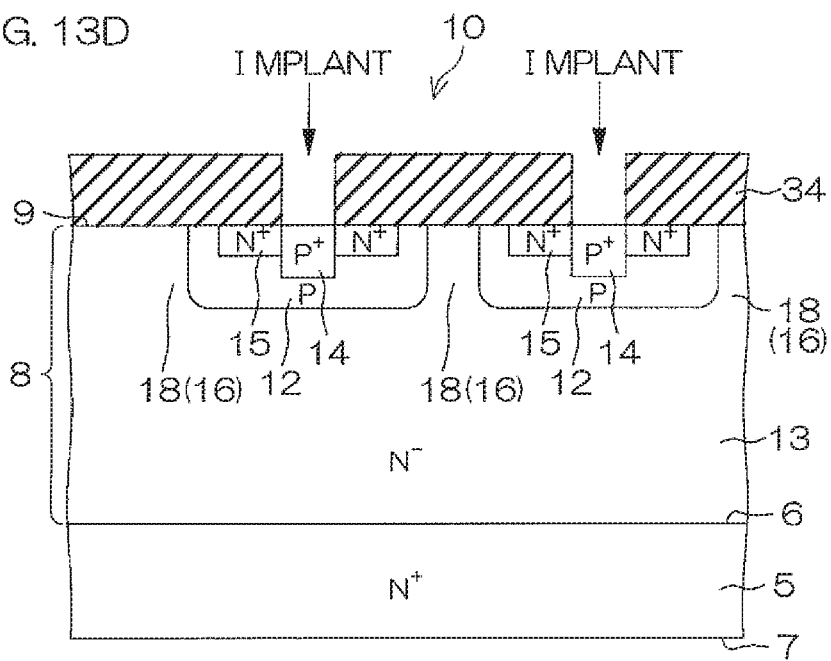

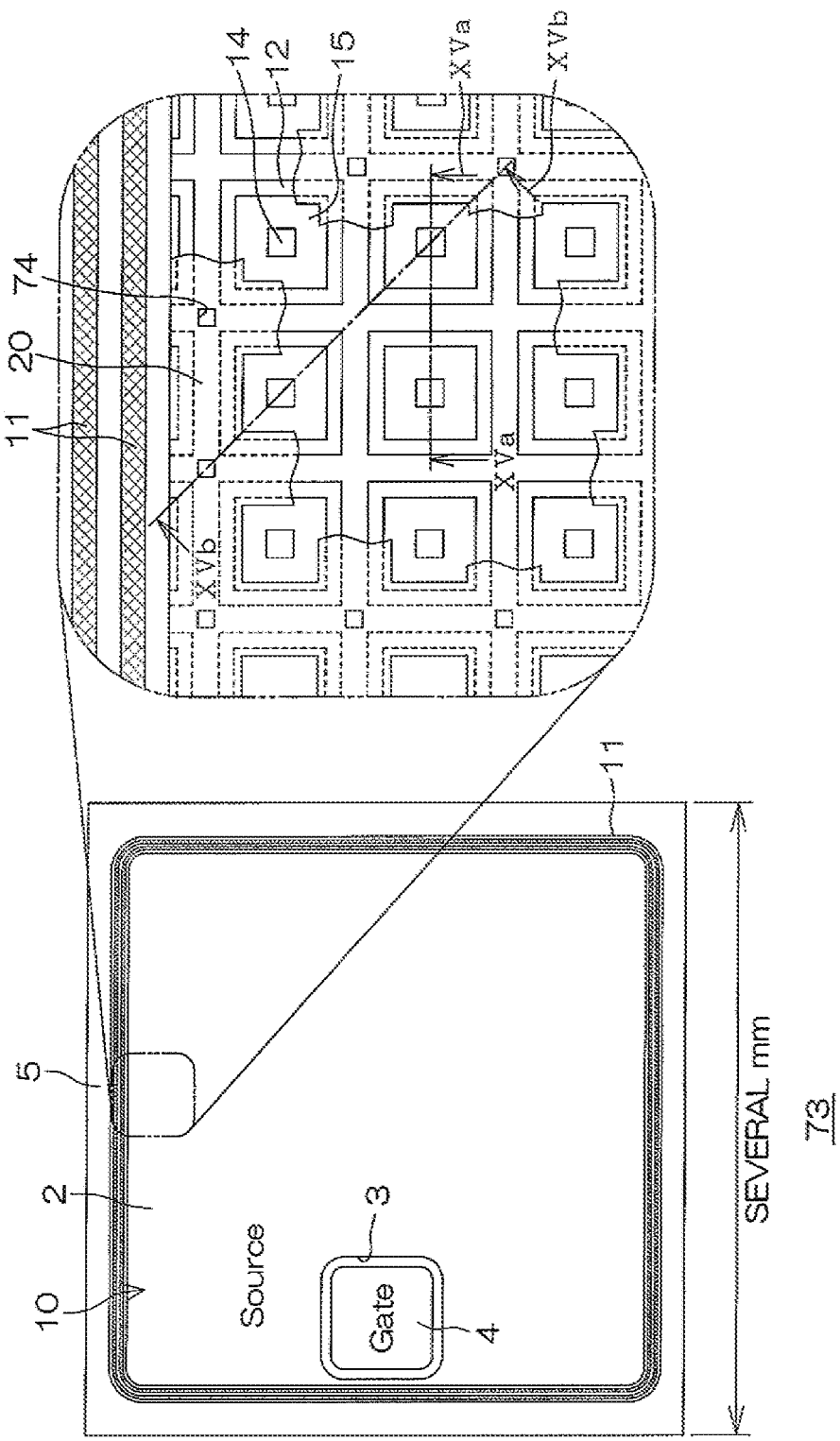

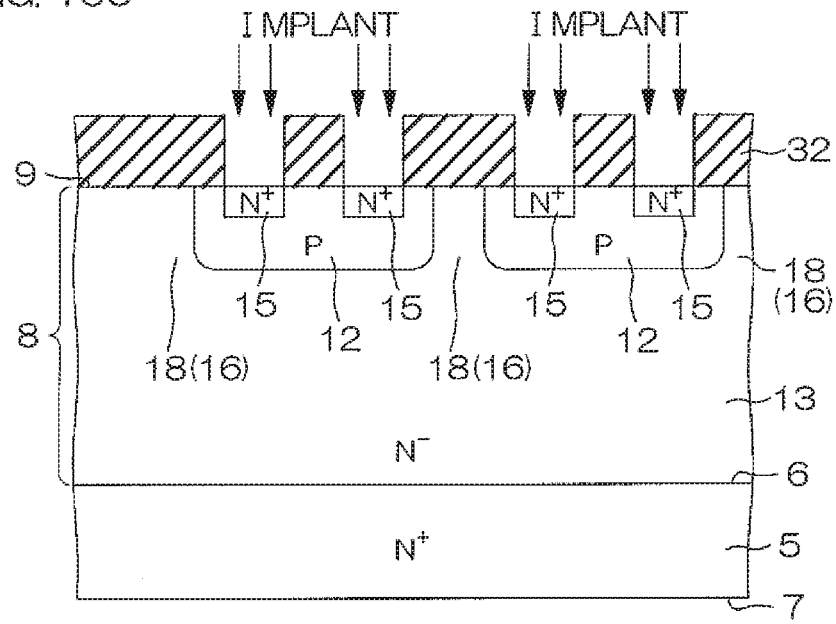
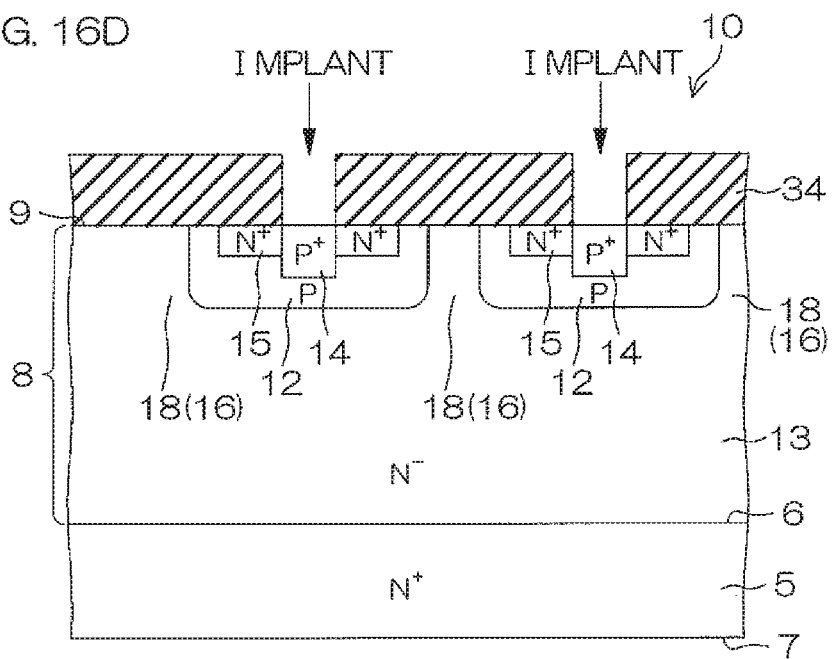

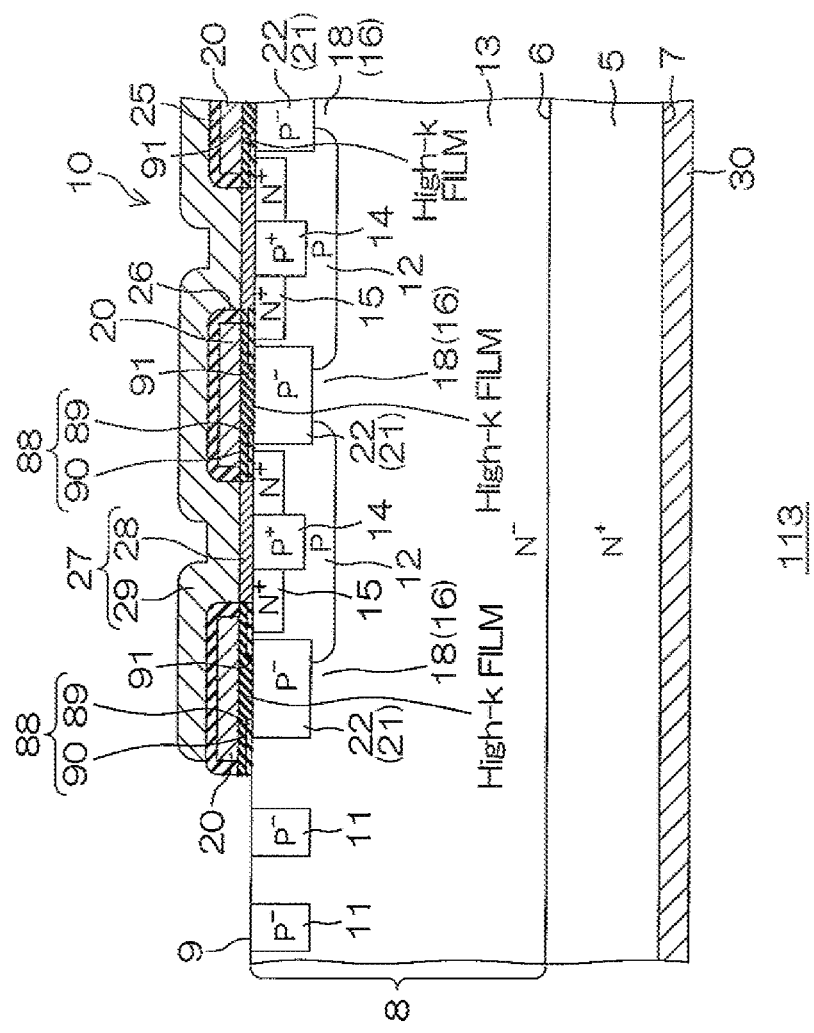
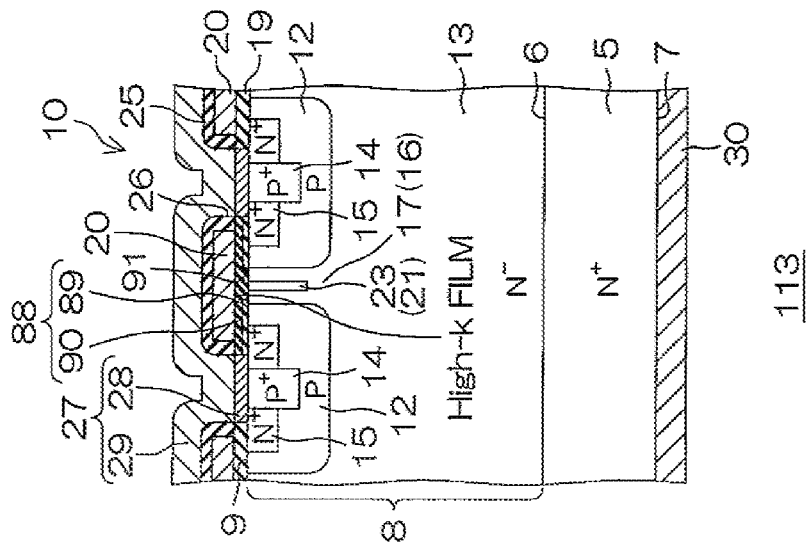

SEMICONDUCTOR DEVICE VDMOS HAVING A GATE INSULATING FILM HAVING A HIGH DIELECTRIC CONSTANT PORTION CONTACTING THE DRIFT REGION FOR RELAXING AN ELECTRIC FIELD GENERATED IN THE GATE INSULATING FILM

CROSS-REFERENCE TO RELATED APPLICATIONS

This is a continuation of U.S. application Ser. No. 13/635,312, which was filed on Sep. 14, 2012, which was a National Stage application of PCT/JP2011/058058, filed on Mar. 30, 2011. The prior US application and the present continuation application claim the benefit of priority of Japanese application 2010-078280, filed on Mar. 30, 2010. The disclosures of these prior US and foreign applications are incorporated herein by reference.

TECHNICAL FIELD

The present invention relates to a semiconductor device, and more detailedly, it relates to a power device employed in the field of power electronics.

BACKGROUND ART

In general, a high withstand voltage semiconductor device (a power device) to which high voltage is applied is employed in the field of power electronics.

A vertical structure capable of easily feeding high current and capable of easily ensuring high withstand voltage and low on-resistance is known as the structure of the power device (for example, Patent Document 1).

A power device of the vertical structure includes an $n^+$-type substrate, an $n^-$-type epitaxial layer stacked on the substrate, p-type body regions plurally formed on a surface layer portion of the epitaxial layer at an interval, and an $n^+$-type source region formed on a surface layer portion of each body region, for example. A gate insulating film is formed to extend between adjacent body regions, and a gate electrode is formed on the gate insulating film. The gate electrode is opposed to each body region through the gate insulating film. A source electrode is electrically connected to the source region. On the other hand, a drain electrode is formed on the back surface of the substrate. Thus, the power device of the vertical structure in which the source electrode and the drain electrode are arranged in a vertical direction perpendicular to the major surface of the substrate is constituted.

Voltage of not less than a threshold is applied to the gate electrode in a state applying voltage between the source electrode and the drain electrode (between a source and a drain), whereby channels are formed in the vicinity of interfaces between the body regions and the gate insulating film due to an electric field from the gate electrode. Thus, current flows between the source electrode and the drain electrode, and the power device enters an ON-state.

PRIOR ART

Patent Document

Patent Document 1: Japanese Unexamined Patent Publication No. 2003-347548

SUMMARY OF THE INVENTION

Problems to be Solved by the Invention

In a conventional vertical structure, however, it is difficult to manufacture a device excellent in withstand voltage with a high yield. In practice, there are cases where many products cannot satisfy withstand voltage standards as conforming articles but are determined as defectives when a high temperature reverse bias (HTRB) test which is one of quality assurance tests is conducted.

More specifically, there are extremely many cases where a spot on a portion of a gate insulating film between adjacent body regions dielectrically breaks down when voltage is continuously applied between a source and a drain in an HTRB test.

An object of the present invention is to provide a semiconductor device excellent in withstand voltage characteristics and manufacturable with a high yield.

Solutions to Problems

A semiconductor device according to the present invention for attaining the aforementioned object includes a semiconductor layer of a first conductivity type, body regions of a second conductivity type plurally formed on a surface layer portion of the semiconductor layer at an interval, a source region of the first conductivity type formed on a surface layer portion of each body region, a gate insulating film provided on the semiconductor layer to extend between the body regions adjacent to each other, a gate electrode provided on the gate insulating film and opposed to the body regions, and a field relaxation portion provided between the body regions adjacent to each other for relaxing an electric field generated in the gate insulating film.

In order to attain the aforementioned object, the inventors have deeply studied the factor of dielectric breakdown of a gate insulating film in a high temperature reverse bias (HTRB) test or in practical use. They have found that the factor is field concentration on the gate insulating film. The HTRB test is a test for confirming withstand voltage of a device by continuously applying voltage approximate to the withstand voltage of the device between a source and a drain under a high temperature in a state where the device is off.

More specifically, when voltage (about 900 V in the HTRB test, for example) rendering a semiconductor layer positive is applied between a source region and the semiconductor layer functioning as a drain (between a source and a drain) in a state where a semiconductor device is off (i.e., a state where gate voltage is 0 V), an electric field is applied to a gate insulating film interposed between a gate electrode and the semiconductor layer. The electric field results from potential difference between the gate electrode and the semiconductor layer. Equipotential surfaces of extremely high potential with reference (0 V) to the gate electrode are distributed between adjacent body regions in the semiconductor layer and the interval between the equipotential surfaces is small, whereby an extremely large electric field is generated. It is such a mechanism that, when the voltage approximate to the withstand voltage of the device is continuously applied between the source and the drain, therefore, a spot on a portion of the gate insulating film between the adjacent body regions cannot withstand the field concentration of the magnitude, but causes dielectric breakdown.

According to the inventive semiconductor device, on the other hand, the field relaxation portion relaxing the electric field generated in the gate insulating film is provided between the adjacent body regions in such a vertical structure that the source region and a region of the semiconductor layer functionable as the drain are arranged in the vertical direction through the body regions. Even if voltage approximate to the withstand voltage is continuously applied between the source and the drain, therefore, dielectric breakdown of the gate insulating film can be suppressed. According to the inventive structure, therefore, a semiconductor device excellent in withstand voltage can be manufactured with a high yield.

The inventors have further investigated a spot where dielectric breakdown is particularly easily caused in a gate insulating film every array pattern (cell layout) of body regions in a semiconductor device, to find the following common feature as to a specific array pattern:

More specifically, they have found that, when noting three body regions among a plurality of body regions arrayed in various patterns and assuming a plurality of straight lines extending between the respective ones of adjacent body regions, dielectric breakdown of a gate insulating film is particularly easily caused around the intersection point between two straight lines included in the straight lines.

When noting three of the body regions and assuming a plurality of straight lines extending between the respective ones of the body regions adjacent to each other, therefore, the field relaxation portion preferably includes a dotlike field relaxation portion provided on the intersection point between two straight lines included in the straight lines. When the field relaxation portion (the dotlike field relaxation portion) is provided on the intersection point between two straight lines included in the plurality of straight lines extending between the respective ones of the adjacent body regions, dielectric breakdown of the gate insulating film around the intersection point can be effectively suppressed.

The field relaxation portion may include a linear field relaxation portion provided on a portion along the straight lines extending between the respective ones of the three body regions arranged on the positions of the respective apexes of a triangle.

Thus, even if an electric field generated along the straight lines extending between the respective ones of the adjacent body regions acts on the gate insulating film, the electric field can be relaxed in the linear field relaxation portion. Consequently, the electric field generated in the gate insulating film can be uniformly relaxed.

The dotlike field relaxation portion may have a sectional area greater than the sectional area of the linear field relaxation portion in an orthogonal direction orthogonal to the straight lines extending between the respective ones of the adjacent body regions, and the dotlike field relaxation portion may overlap with the body regions in plan view. Further, the dotlike field relaxation portion may be in the form of a square in plan view.

The linear field relaxation portion may be formed integrally with the dotlike field relaxation portion, or may be formed to separate from the dotlike field relaxation portion.

When four body regions are arrayed in the form of a matrix of two rows and two columns in plan view, the dotlike field relaxation portion is preferably provided on a position overlapping with a region where a line region extending between the respective ones of the body regions in the form of the matrix in a row direction and a line region extending between the respective ones in a column direction intersect with each other in plan view.

When the four body regions are arrayed in the form of the matrix of two rows and two columns, dielectric breakdown of the gate insulating film is particularly easily caused around the region (an intersectional region) where the line regions extending between the respective ones of the body regions in the row direction and in the column direction respectively intersect with each other.

When the dotlike field relaxation portion is provided on the position overlapping with the region where the line regions extending in the row direction and in the column direction respectively intersect with each other in plan view, therefore, dielectric breakdown of the gate insulating film around the intersectional region can be effectively suppressed.

When the body regions are elongationally formed and arrayed along the width direction orthogonal to the longitudinal direction thereof, the field relaxation portion is preferably provided on a position overlapping with a longitudinal end portion of a line region extending between the adjacent body regions along the longitudinal direction in plan view.

When the body regions are elongationally formed and arrayed along the width direction orthogonal to the longitudinal direction thereof, dielectric breakdown of the gate insulating film is particularly easily caused around the longitudinal end portion of the line region extending between the adjacent body regions along the longitudinal direction. When the field relaxation portion is provided on the position overlapping with the longitudinal end portion of the line region extending between the adjacent body regions along the longitudinal direction in plan view, therefore, dielectric breakdown of the gate insulating film around the end portion can be effectively suppressed.

In the case where the body regions are elongationally formed, further, the field relaxation portion is preferably further provided also on a portion along the line region extending between the adjacent body regions along the longitudinal direction.

The plane area of the field relaxation portion may be smaller than the plane area of the body regions.

A field relaxation portion may include an implantation region formed by implanting a second conductivity type impurity between the body regions adjacent to each other on the semiconductor layer.

A depletion layer resulting from junction (p-n junction) between the implantation region and the semiconductor layer can be formed between the adjacent body regions on the semiconductor layer by forming the implantation region of the second conductivity type different from the conductivity type of the semiconductor layer. Equipotential surfaces of high potential with reference to the gate electrode can be separated from the gate insulating film, due to the presence of the depletion layer. Consequently, the electric field applied to the gate insulating film can be reduced, whereby dielectric breakdown can be suppressed.

The implantation region may be formed by implanting Al or B as the second conductivity type impurity.

The implantation region may be increased in resistance due to the implantation of the second conductivity type impurity into the semiconductor layer, and in this case, the same may be increased in resistance due to implantation of Al, B, Ar or V.

In a case where the gate insulating film has a relatively thin thin-film portion opposed to the body regions and a relatively thick thick-film portion opposed to a portion of the semiconductor layer located between the body regions, the field relaxation layer may include the thick-film portion as the field relaxation portion.

In the gate insulating film, the portion opposed to the portion of the semiconductor layer located between the body regions is so increased in thickness that dielectric breakdown withstand voltage of the portion (the thick-film portion) can be rendered greater than that of the remaining portion. Even if the electric field is applied to the thick-film portion, therefore, the thick-film portion does not dielectrically break down, but can relax the applied electric field therein. On the other hand, the portion opposed to the body regions is the thin-film portion in the gate insulating film, whereby an electric field generated by applying voltage to the gate electrode for forming channels in the body regions can be inhibited from weakening in the gate insulating film. Therefore, the withstand voltage can be improved while suppressing reduction of a transistor function of the semiconductor device.

In a case where the gate electrode has a through-hole in a portion opposed to the portion of the semiconductor layer located between the body regions and an interlayer dielectric film formed on the semiconductor layer to cover the gate electrode and having an embedded portion embedded in the through-hole is formed, the field relaxation layer may include the embedded portion of the interlayer dielectric film as the field relaxation portion.

Thus, it follows that the portion of the gate insulating film opposed to the portion of the semiconductor layer located between the body regions is interposed between the semiconductor layer and the insulating embedded portion. Even if an electric field results from the potential difference between the gate electrode and the semiconductor layer, therefore, the electric field can be rendered hardly applicable to the portion of the gate insulating film opposed to the portion located between the adjacent body regions. Consequently, a total electric field applied to the portion of the gate insulating film can be relaxed.

In a case where the gate insulating film has a low dielectric constant portion opposed to the body regions and a high dielectric constant portion opposed to the portion of the semiconductor layer located between the body regions, the field relaxation layer may include the high dielectric constant portion as the field relaxation portion.

The portion of the gate insulating film opposed to the portion of the semiconductor layer located between the body regions is so brought into the high dielectric constant portion that dielectric breakdown withstand voltage of the portion (the high dielectric constant portion) can be rendered greater than that of the remaining portion. Even if an electric field is applied to the high dielectric constant portion, therefore, the high dielectric constant portion does not dielectrically break down, but can relax the applied electric field therein. On the other hand, the portion of the gate insulating film opposed to the body regions is the low dielectric constant portion, whereby an electric field generated by applying voltage to the gate electrode for forming channels in the body regions can be inhibited from weakening in the gate insulating film. Therefore, the withstand voltage can be improved while suppressing reduction of the transistor function of the semiconductor device.

In a case where the semiconductor layer has a protrusion formed by raising the surface thereof between the body regions, the field relaxation layer may include the protrusion as the field relaxation portion.

The protrusion is so provided between the adjacent body regions that the distance from the back surface of the semiconductor layer up to the gate insulating film lengthens by the quantity of projection of the protrusion between the body regions. As compared with a case where no protrusion is provided, therefore, the semiconductor layer can sufficiently drop voltage applied to the gate insulation film. Therefore, voltage of equipotential surfaces distributed immediately under the gate insulating film between the body regions can be reduced. Consequently, the electric field applied to the gate insulating film can be relaxed.

The impurity of the second conductivity type is preferably implanted into the protrusion.

Thus, a depletion layer resulting from junction (p-n junction) between the protrusion and the remaining portion of the semiconductor layer can be formed between the body regions. Equipotential surfaces of high potential with reference to the gate electrode can be separated from the gate insulating film, due to the presence of the depletion layer. Consequently, the electric field applied to the gate insulating film can be further reduced.

In the case where the gate insulating film has the low dielectric constant portion and the high dielectric constant portion, the protrusion is preferably covered with the high dielectric constant portion, and in this case, the field relaxation portion includes both of the protrusion and the high dielectric constant portion.

According to the structure in which the protrusion is covered with the high dielectric constant portion, dielectric breakdown withstand voltage of the high dielectric constant portion can be rendered greater than that of the remaining portion of the gate insulating film. Therefore, an effect of field relaxation by the high dielectric constant portion can also be relished, in addition to an effect of field relaxation by the protrusion.

The high dielectric constant portion may be formed to cover the protrusion and to be opposed to the body regions. In that case, the low dielectric constant portion may be interposed between the body regions and a portion of the high dielectric constant portion opposed to the body regions.

In a case where the low dielectric constant portion is formed to be opposed to the body regions and to cover the protrusion, the high dielectric constant portion may be interposed between the protrusion and a portion of the low dielectric constant portion covering the protrusion.

In the case where the gate insulating film has the relatively thin thin-film portion opposed to the body regions and the relatively thick thick-film portion opposed to the implantation region in the semiconductor layer, the field relaxation portion may be constituted of the implantation region and the thick-film portion. Thus, effects of field relaxation by both of the implantation region and the thick-film portion can be relished.

In a case where the gate electrode has a through-hole in a portion opposed to the implantation region on the semiconductor layer and an interlayer dielectric film having an embedded portion embedded in the through-hole is formed on the semiconductor layer to cover the gate electrode, the field relaxation portion may be constituted of the implantation region and the embedded portion. Thus, effects of field relaxation by both of the implantation region and the embedded region can be relished.

In a case where the gate insulating film has a low dielectric constant portion opposed to the body regions and a high dielectric constant portion opposed to the implantation region on the semiconductor layer, the field relaxation portion may be constituted of the implantation region and the high dielectric constant portion. Thus, effects of field relaxation by both of the implantation region and the high dielectric constant portion can be relished.

The semiconductor layer preferably has a dielectric breakdown electric field of not less than 1 MV/cm, and is preferably made of SiC, for example. An electric field easily concentrates on the gate insulating film on the SiC semiconductor layer due to step punching on an SiC single-crystalline growth surface, and hence an effect at a time of applying the present invention is remarkable. As a semiconductor layer having a dielectric breakdown electric field of not less than 1 MV/cm, 3C—SiC (3.0 MV/cm), 6H—SiC (3.0 MV/cm), 4H—SiC (3.5 MV/cm), GaN (2.6 MV/cm), diamond (5.6 MV/cm) or the like can be listed, for example.

The body regions may be in the form of regular polygons in plan view, and may be in the form of squares in plan view, for example.

In a case where the body regions are in the form of regular hexagons in plan view, the body regions are preferably arrayed in the form of a honeycomb.

Further, the body regions may be in the form of circles in plan view.

BRIEF DESCRIPTION OF THE DRAWINGS

FIG. 1A and FIG. 1B are schematic plan views of a semiconductor device according to a first embodiment of the present invention, while FIG. 1A shows a general diagram and FIG. 1B shows an enlarged internal diagram respectively.

FIG. 2A and FIG. 2B are schematic sectional views of the semiconductor device according to the first embodiment of the present invention, while FIG. 2A shows a cutting plane along a cutting plane line IIa-IIa in FIG. 1A and FIG. 2B shows a cutting plane along a cutting plane line IIb-IIb in FIG. 1B respectively.

FIG. 3E is a diagram showing a step subsequent to FIG. 3D.

FIG. 3F is a diagram showing a step subsequent to FIG. 3E.

FIG. 3K is a diagram showing a step subsequent to FIG. 3J.

FIG. 4A and FIG. 4B are diagrams for illustrating a first modification of the semiconductor device according to the first embodiment, while FIG. 4A shows a schematic plan view and FIG. 4B shows a cutting plane along a cutting plane line IVb-IVb in FIG. 4A respectively.

FIG. 5A and FIG. 5B are diagrams for illustrating a second modification of the semiconductor device according to the first embodiment, while FIG. 5A shows a schematic plan view and FIG. 5B shows a cutting plane along a cutting plane line Vb-Vb in FIG. 5A respectively.

FIG. 8A and FIG. 8B are schematic plan views for illustrating a fifth modification of the semiconductor device according to the first embodiment, while FIG. 8A shows a schematic plan view and FIG. 8B shows a cutting plane along a cutting plane line VIIIb-VIIIb in FIG. 8A respectively.

FIG. 9 is a schematic plan view for illustrating a sixth modification of the semiconductor device according to the first embodiment.

FIG. 10 is a schematic plan view for illustrating a seventh modification of the semiconductor device according to the first embodiment.

FIG. 11A and FIG. 11B are schematic plan views of a semiconductor device according to a second embodiment of the present invention, while FIG. 11A shows a general diagram and FIG. 11B shows an enlarged internal diagram respectively.

FIG. 12A and FIG. 12B are schematic sectional views of the semiconductor device according to the second embodiment of the present invention, while FIG. 12A shows a cutting plane along a cutting plane line XIIa-XIIa in FIG. 11B and FIG. 12B shows a cutting plane along a cutting plane line XIIb-XIIb in FIG. 11B respectively.

FIG. 14A and FIG. 14B are schematic plan views of a semiconductor device according to a third embodiment of the present invention, while FIG. 14A shows a general diagram and FIG. 14B shows an enlarged internal diagram respectively.

FIG. 15A and FIG. 15B are schematic sectional views of the semiconductor device according to the third embodiment of the present invention, while FIG. 15A shows a cutting plane line along a cutting plane line XVa-XVa in FIG. 14B and FIG. 15B shows a cutting plane along a cutting plane line XVb-XVb in FIG. 14B respectively.

FIG. 30A and FIG. 30B are schematic sectional views of a semiconductor device according to an eighth embodiment of the present invention.

MODES FOR CARRYING OUT THE INVENTION

Embodiments of the present invention are now described in detail with reference to the attached drawings.

First Embodiment: Field Relaxation by Implantation Region

Figure 1B:
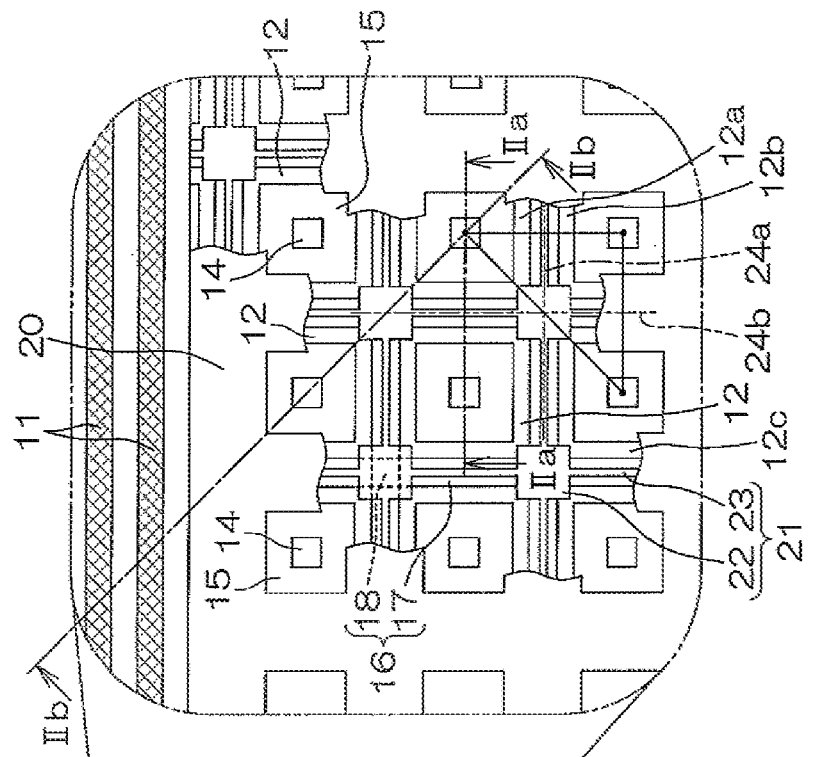
Figure 1A:
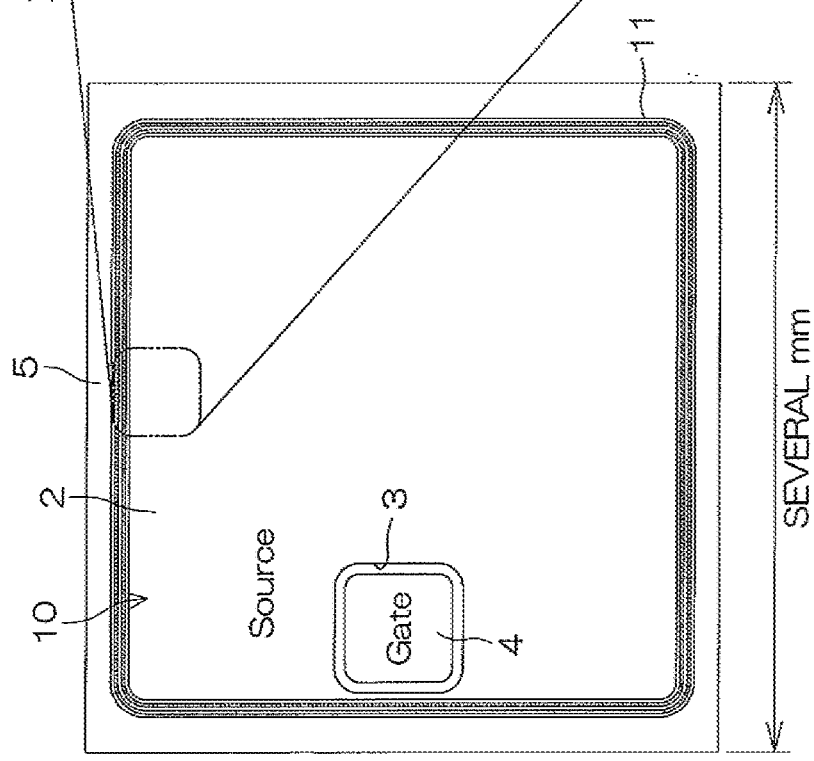

FIGS. 1A and 1B are schematic plan views of a semiconductor device according to a first embodiment of the present invention, while FIG. 1A shows a general diagram and FIG. 1B shows an enlarged internal diagram respectively. FIGS. 2A and 2B are schematic sectional views of the semiconductor device according to the first embodiment of the present invention, while FIG. 2A shows a cutting plane along a cutting plane line IIa-IIa in FIG. 1A and FIG. 2B shows a cutting plane along a cutting plane line IIb-IIb in FIG. 1B respectively.

This semiconductor device 1 is a planar gate VDMOS-FET employing SiC, and in the form of a chip square in plan view, as shown in FIG. 1A, for example. In the chip-shaped semiconductor device 1, the lengths in the vertical and horizontal directions in the plane of FIG. 1A are about several mm respectively.

A source pad 2 is formed on the surface of the semiconductor device 1. The source pad 2 is generally in the form of a square in plan view whose four corners are bent outward, and formed to cover generally the whole region of the surface of the semiconductor device 1. In the source pad 2, a removed region 3 generally square in plan view is formed around the center of one side thereof. The removed region 3 is a region where the source pad 2 is not formed.

A gate pad 4 is arranged on the removed region 3. An interval is provided between the gate pad 4 and the source pad 2, which are insulated from each other.

The internal structure of the semiconductor device 1 is now described.

The semiconductor device 1 includes an SiC substrate 5 of an n$^+$-type (whose concentration is $1 \times 10^{18}$ to $1 \times 10^{21}$ cm$^{-3}$, for example). According to the embodiment, the SiC substrate 5 functions as a drain of the semiconductor device 1, while a surface 6 (upper surface) thereof is an Si plane, and a back surface 7 (lower surface) thereof is a C plane.

An epitaxial layer 8 made of SiC of an n$^-$-type (whose concentration is $1 \times 10^{15}$ to $1 \times 10^{17}$ cm$^{-3}$, for example) in a lower concentration than the SiC substrate 5 is stacked on the SiC substrate 5. The epitaxial layer 8 as a semiconductor layer is formed on the SiC substrate 5 by the so-called epitaxial growth. The epitaxial layer 8 formed on the surface 6 which is the Si plane is grown with a major growth surface of an Si plane. Therefore, a surface 9 of the epitaxial layer 8 formed by the epitaxial growth is an Si plane, similarly to the surface 6 of the SiC substrate 5.

An active region 10 arranged on a central portion of the epitaxial layer 8 in plan view to function as a field-effect transistor is formed on the semiconductor device 1, as shown in FIG. 1A. A plurality of (in this embodiment, two) guard rings 11 are formed on the epitaxial layer 8 at an interval from the active region 10, to surround the active region 10.

The interval between the active region 10 and the guard rings 11 is generally constant universally over the whole periphery. The guard rings 11 are low-concentration regions of a p$^-$-type (whose concentration is $1 \times 10^{13}$ to $1 \times 10^{18}$ cm$^{-3}$, for example) formed by implanting a p-type impurity into the epitaxial layer 8.

On the side (the Si plane side) of the surface 9 of the epitaxial layer 8 in the active region 10, p-type body regions 12 are formed in a large number to be arrayed in the form of a matrix at a constant pitch in a row direction and a column direction. Each body region 12 is in the form of a square in plan view, and the lengths in the vertical and horizontal directions in the plane of FIG. 1B are about 7.2 µm respectively, for example. The depth of the body region 12 is about 0.65 µm, for example. The concentration in the body region 12 is about $1 \times 10^{16}$ to $1 \times 10^{19}$ cm$^{-3}$, for example. On the other hand, a region of the epitaxial layer 8 closer to the SiC substrate 5 (closer to the C plane) than the body regions 12 is an n$^-$-type drift region 13 where the state after the epitaxial growth is maintained.

On a surface layer portion of each body region 12, a body contact region 14 is formed on a central portion thereof, and a source region 15 is formed to surround the body contact region 14. The body contact region 14 is in the form of a square in plan view, and the lengths in the vertical and horizontal directions in the plane of FIG. 1B are about 1.6 µm respectively, for example. The depth of the body contact region 14 is 0.35 µm, for example.

The source region 15 is in the form of a square ring in plan view, and the lengths in the vertical and horizontal directions in the plane of FIG. 1B are about 5.7 µm respectively, for example. The depth of the source region 15 is about 0.25 µm, for example.

In the active region 10, regions (interbody regions 16 held between side surfaces of adjacent body regions 12) between the respective ones of the body regions 12 arrayed in the form of the matrix at the constant pitch are in the form of a lattice having a constant (2.8 µm, for example) width.

The interbody regions 16 include line regions 17 linearly extending in the respective ones of the row direction and the column direction along four side surfaces of each body region 12 and intersectional regions 18 where the line regions 17 extending in the row direction and the line regions 17 extending in the column direction intersect with one another. Noting body regions 12 arrayed in two rows and two columns in plan view, the intersectional region 18 is a square-shaped region surrounded by inner corners of the arrayed four body regions 12 and partitioned by extensions of four sides of the body regions 12 (a region surrounded by square broken lines in FIG. 1B.

On the interbody regions 16, a latticed gate insulating film 19 is formed along the interbody regions 16. The gate insulating film 19 extends over adjacent body regions 12, and covers portions (peripheral edge portions of the body regions 12) of the body regions 12 surrounding the source regions 15 and outer peripheral edges of the source regions 15. The gate insulating film 19 is made of SiO$_2$ (silicon oxide), and the thickness thereof is about 400 Å and generally uniform. The gate insulating film 19 may be formed by an oxide film containing nitrogen, such as a silicon oxynitride film prepared by thermal oxidation employing gas containing nitrogen and oxygen, for example.

A gate electrode 20 is formed on the gate insulating film 19. The gate electrode 20 is formed in a latticed manner along the latticed gate insulating film 19, and opposed to the peripheral edge portion of each body region 12 through the gate insulating film 19. The gate electrode 20 is made of polysilicon, and a p-type impurity is introduced thereinto in a high concentration, for example. The thickness of the gate electrode 20 is about 6000 Å, for example.

In the semiconductor device 1, boundaries between unit cells are set at width-directional centers of the interbody regions 16. In each unit cell, the lengths in the vertical and horizontal directions in the plane of FIG. 1B are about 10 µm respectively, for example. In each unit cell, the depth direction of the body regions 12 is a gate length direction, and the circumferential direction of the body regions 12 orthogonal to the gate length direction is a gate width direction. In each unit cell, drain current flowing toward the side of the surface 9 of the epitaxial layer 8 along four side surfaces of each body region 12 in the drift region 13 can be fed to the source region 15 by controlling voltage applied to the gate electrode 20 thereby forming annular channels in the peripheral edge portions of the body regions 12 of each unit cell.

A p$^-$-type implantation region 21 as a field relaxation layer formed by implanting a p-type impurity into the epitaxial layer 8 is formed on the interbody regions 16 of the epitaxial layer 8. The depth of the implantation region 21 is about 0.65 µm (shallower than the body regions 12), for example. The concentration in the implantation region 21 is lower than the concentration in the body regions 12, and $1 \times 10^{13}$ to $1 \times 10^{18}$ cm$^{-3}$, for example. The implantation region 21 may be an i-type (intrinsic semiconductor) region whose impurity concentration is not more than $1 \times 10^{16}$ cm$^{-3}$, of a region increased in resistance, for example. The concentration in the implantation region 21 may be higher than the concentration in the body regions 12.

The implantation region 21 is in the form of a lattice formed over the whole areas of the interbody regions 16, and integrally includes intersectional portions 22 formed on the intersectional regions 18 and linear portions 23 as linear field relaxation portions formed on the line regions 17.

Each intersectional portion 22 is in the form of a square slightly larger than each intersectional region 18 in plan view, and the respective corners thereof enter corners of four body regions 12 facing the intersectional region 18 respectively. In a case of noting three body regions 12 (body regions 12a to 12c in FIG. 1B, for example) arranged on positions of respective apexes of a triangle among the large number of body regions 12 arrayed in the form of the matrix and assuming two straight lines 24a and 24b extending between the respective ones of the adjacent body regions 12a to 12c, it can be said that the intersectional region 22 is provided on the intersection point therebetween.

The linear portions 23 are in the form of straight lines of a constant width linking centers of respective sides of intersectional portions 22 adjacent to one another in plan view, and at intervals from side surfaces of the body regions 12. The intervals are so provided between the linear portions 23 and the body regions 12 that a path of drain current flowing along four side surfaces of each body region 12 in an ON-state of the semiconductor device 1 can be ensured. Thus, increase in on-resistance can be suppressed, and an excellent transistor operation can be performed.

An interlayer dielectric film 25 made of SiO$_2$ is formed on the epitaxial layer 8, to cover the gate electrode 20. Contact holes 26 are formed in the interlayer dielectric film 25. Central portions of the source regions 15 and the whole of the body contact regions 14 are exposed in the contact holes 26.

A source electrode 27 is formed on the interlayer dielectric film 25. The source electrode 27 is collectively in contact with the body contact regions 14 and the source regions 15 of all unit cells through the respective contact holes 26. In other words, the source electrode 27 serves as a wire common to all unit cells. An interlayer dielectric film (not shown) is formed on the source electrode 27, and the source electrode 27 is electrically connected to the source pad 2 (see FIG. 1A) through the interlayer dielectric film (not shown). On the other hand, the gate pad 4 (see FIG. 1A) is electrically connected to the gate electrode 20 through a gate wire (not shown) drawn onto the interlayer dielectric film (not shown).

The source electrode 27 has such a structure that a Ti/TiN layer 28 and an Al layer 29 are stacked successively from the side in contact with the epitaxial layer 8.

A drain electrode 30 is formed on the back surface 7 of the SiC substrate 5, to cover the whole area thereof. The drain electrode 30 serves as an electrode common to all unit cells. Such a multilayer structure (Ti/Ni/Au/Ag) that Ti, Ni, Au and Ag are stacked successively from the side of the SiC substrate 5 can be applied as the drain electrode 30, for example.

FIGS. 3A to 3K are schematic sectional views for illustrating a method of manufacturing the semiconductor device shown in FIG. 2B.

Figure 3A:
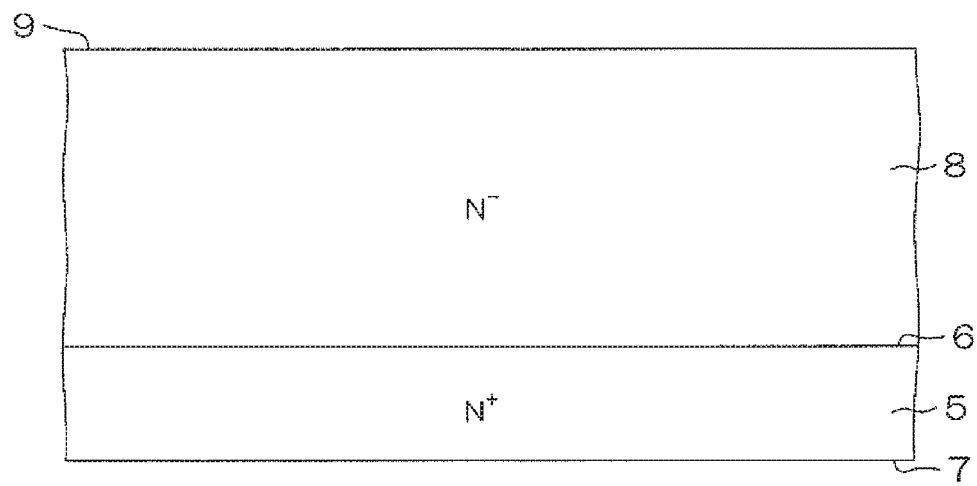
FIG. 3A is a schematic sectional view for illustrating a method of manufacturing the semiconductor device shown in FIG. 2B.

In order to manufacture the semiconductor device 1, an SiC crystal is first grown on the surface 6 (the Si plane) of the Si substrate 5 by epitaxy such as CVD (Chemical Vapor Deposition), LPE (Liquid Phase Epitaxy) or MBE (Molecular Beam Epitaxy), for example, while introducing an n-type impurity (n (nitrogen) in this embodiment), as shown in FIG. 3A. Thus, the n$^-$-type epitaxial layer 8 is formed on the SiC substrate 5.

Figure 3B:
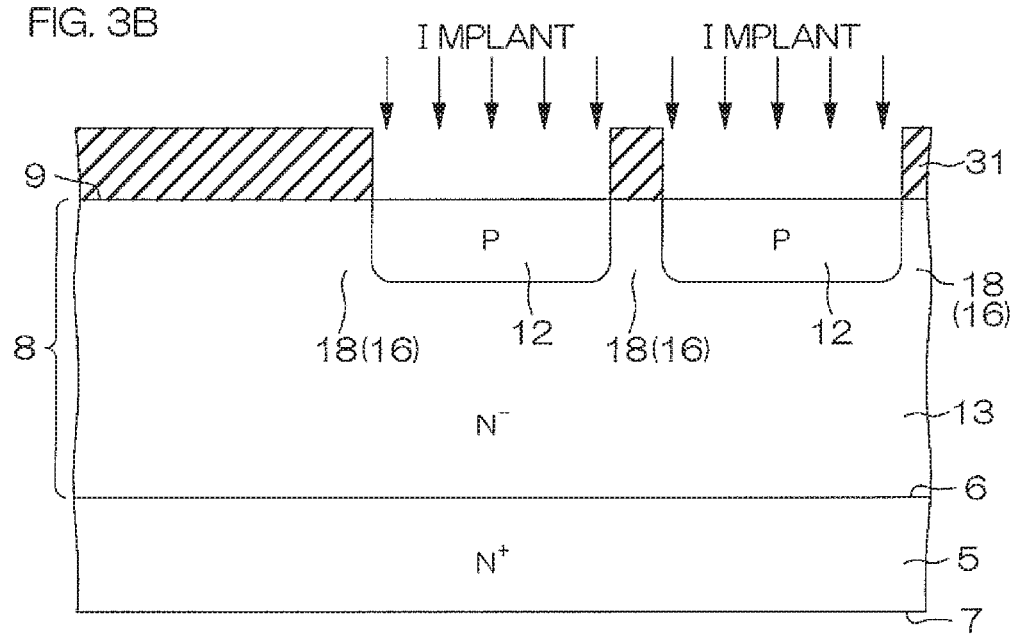
FIG. 3B is a diagram showing a step subsequent to FIG. 3A.

Then, a p-type impurity (Al (aluminum) in this embodiment) is implanted from the surface 9 of the epitaxial layer 8 into the epitaxial layer 8 by employing an SiO$_2$ mask 31 having openings in portions for forming the body regions 12, as shown in FIG. 3B. While the implantation conditions at this time vary with the type of the p-type impurity, the dose is about 6×10$^{13}$ cm$^{-2}$ and acceleration energy is about 380 keV, for example. Thus, the body regions 12 are formed on the surface layer portion of the epitaxial layer 8. Further, the drift region 13 maintaining the state after the epitaxial growth is formed on a base layer portion of the epitaxial layer 8.

Figure 3C:
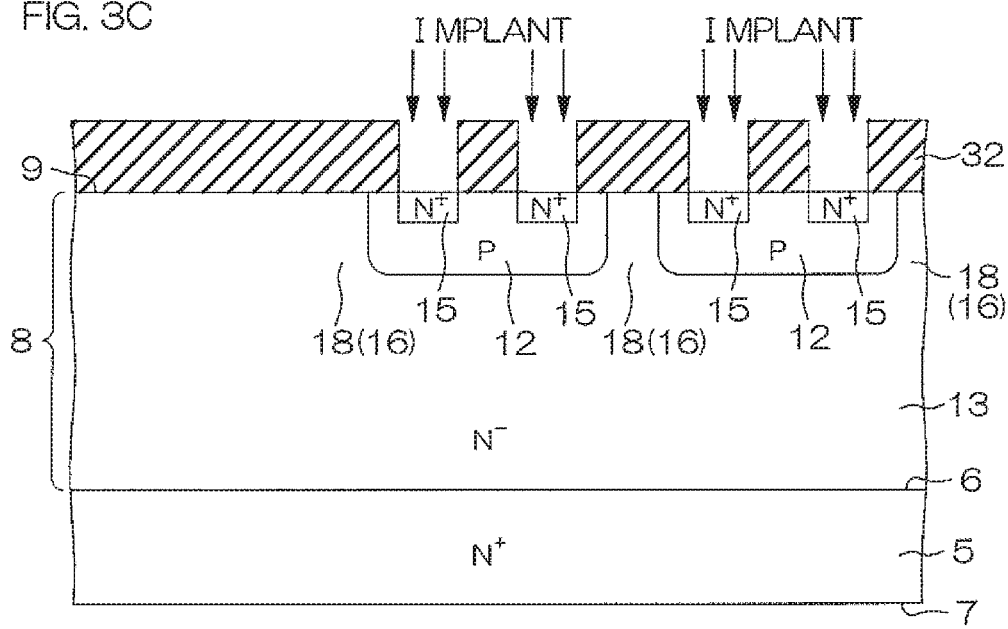
FIG. 3C is a diagram showing a step subsequent to FIG. 3B.

Then, an n-type impurity (P (phosphorus) in this embodiment) is implanted from the surface 9 of the epitaxial layer 8 into the epitaxial layer 8 by employing an SiO$_2$ mask 32 having openings in regions for forming the source regions 15, as shown in FIG. 3C. While the implantation conditions at this time vary with the type of the n-type impurity, the dose is about 2.5×10$^{15}$ cm$^{-2}$ and acceleration energy is in four stages in the range of 30 keV to 160 keV, for example. Thus, the source regions 15 are formed on the surface layer portions of the body regions 12.

Figure 3D:
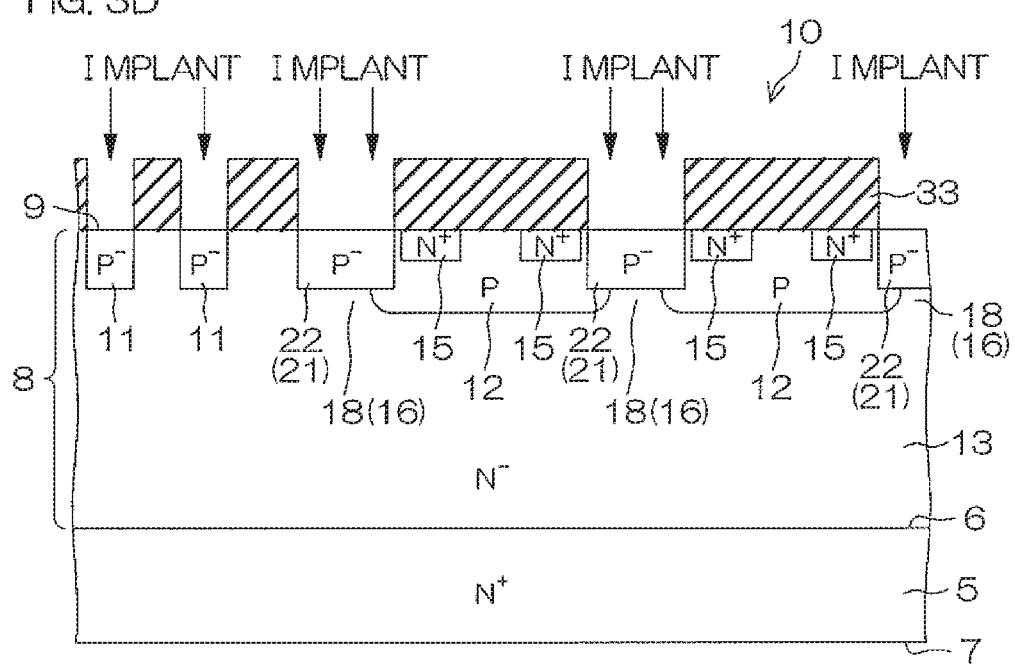
FIG. 3D is a diagram showing a step subsequent to FIG. 3C.

Then, a p-type impurity (Al in this embodiment) is implanted from the surface 9 of the epitaxial layer 8 into the epitaxial layer 8 by employing an SiO$_2$ mask 33 having openings in regions for forming the implantation region 21 and the guard rings 11, as shown in FIG. 3D. While the implantation conditions at this time vary with the type of the p-type impurity, the dose is about 2.7×10$^{13}$ cm$^{-2}$ and acceleration energy is about 380 keV, for example. Thus, the implantation region 21 and the guard rings 11 are simultaneously formed, and the active region 10 is partitioned. In a case of forming the implantation region 21 increased in resistance, Al, B, Ar or V may be implanted in conditions such as a dose of about 1×10$^{13}$ cm$^{-2}$ to 1×10$^{15}$ cm$^{-2}$ and acceleration energy of about 30 keV to 100 keV, for example.

Then, a p-type impurity (Al in this embodiment) is implanted from the surface 9 of the epitaxial layer 8 into the epitaxial layer 8 by employing an SiO$_2$ mask 34 having openings in regions for forming the body contact regions 14, as shown in FIG. 3E. While the implantation conditions at this time vary with the type of the p-type impurity, the dose is about 3.7×10$^{15}$ cm$^{-2}$ and acceleration energy is in four stages in the range of 30 keV to 180 keV, for example. Thus, the body contact regions 14 are formed.

Then, the epitaxial layer 8 is annealed at 1400° C. to 2000° C. for 2 to 10 minutes, for example, as shown in FIG. 3F. Thus, ions of the individual n-type impurities and p-type impurities implanted into the surface layer portion of the epitaxial layer 8 are activated. The annealing of the epitaxial layer 8 can be performed by controlling a resistance heating furnace or a high-frequency induction heating furnace at a proper temperature, for example.

Figure 3G:
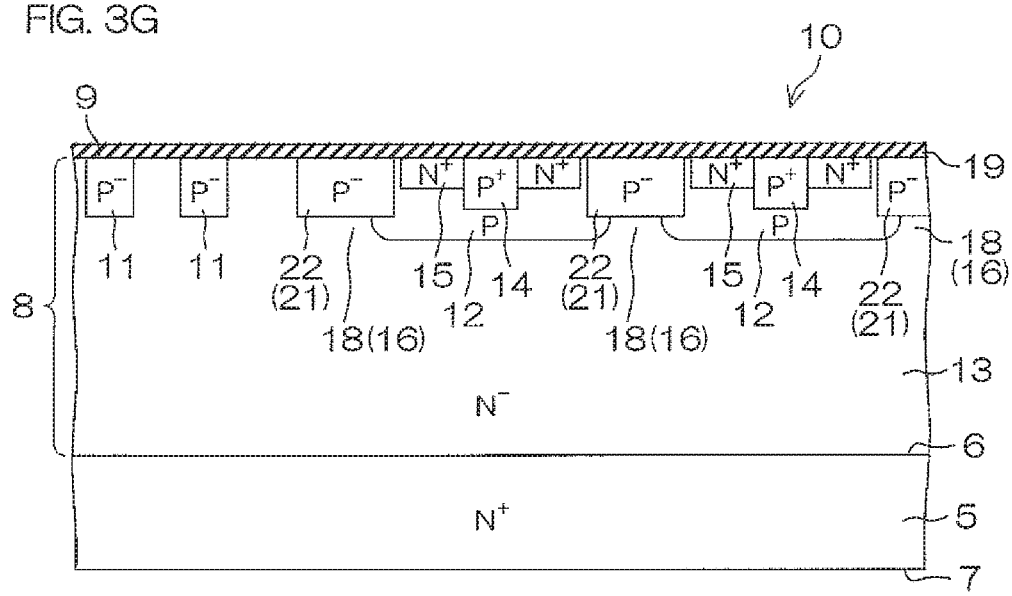
FIG. 3G is a diagram showing a step subsequent to FIG. 3F.

Then, the surface 9 of the epitaxial layer 8 is so thermally oxidized that the gate insulating film 19 covering the whole area of the surface 9 is formed, as shown in FIG. 3G.

Figure 3H:
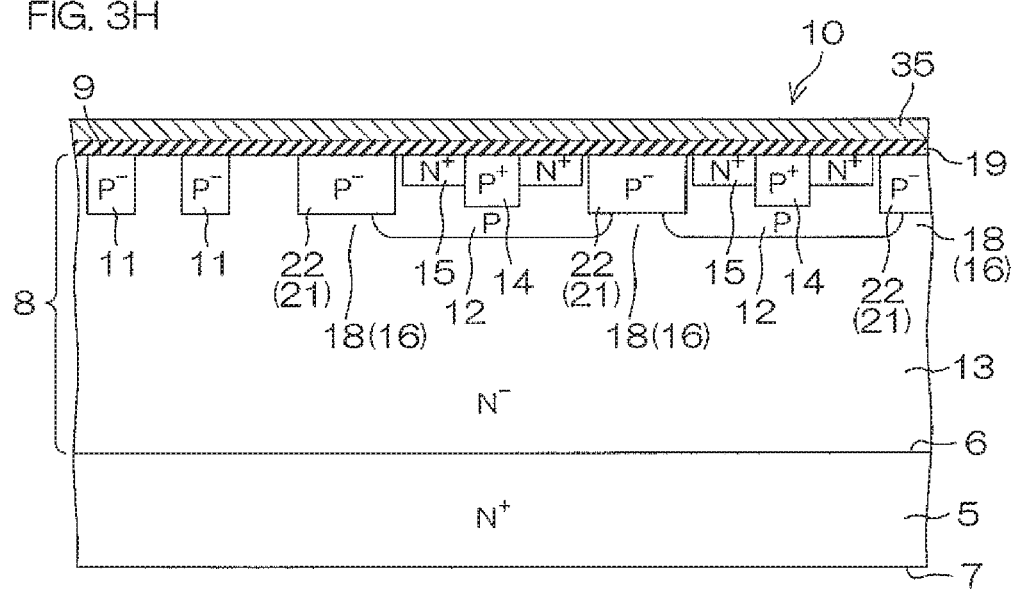
FIG. 3H is a diagram showing a step subsequent to FIG. 3G.

Then, a polysilicon material 35 is deposited on the epitaxial layer 8 by CVD while introducing a p-type impurity (B (boron) in this embodiment), as shown in FIG. 3H.

Figure 3I:
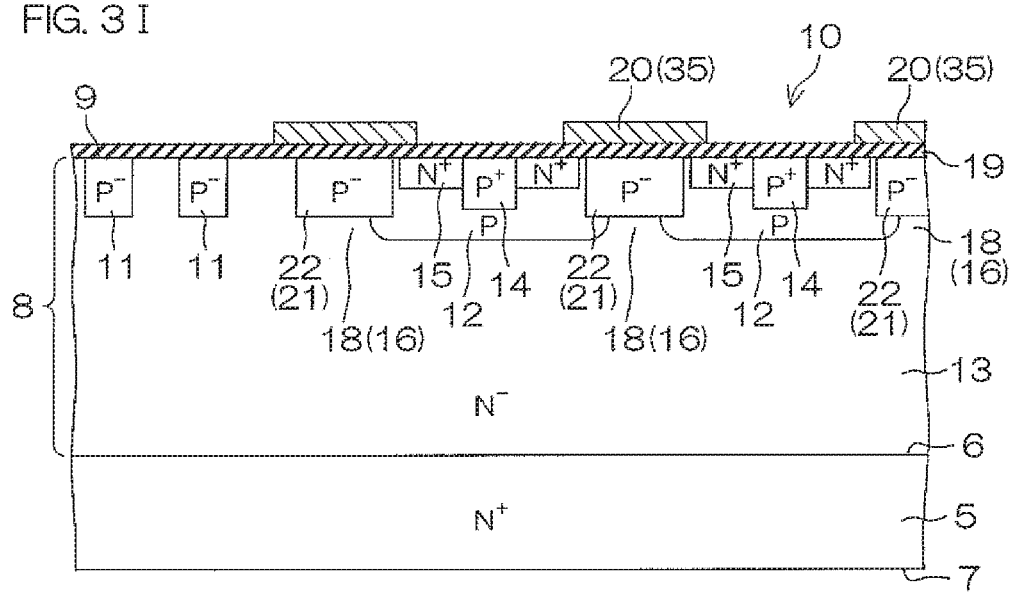
FIG. 3I is a diagram showing a step subsequent to FIG. 3H.

Thereafter unnecessary portions (portions other than the gate electrode 20) of the deposited polysilicon material 35 are removed by dry etching, as shown in FIG. 3I. Thus, the gate electrode 20 is formed.

Figure 3J:
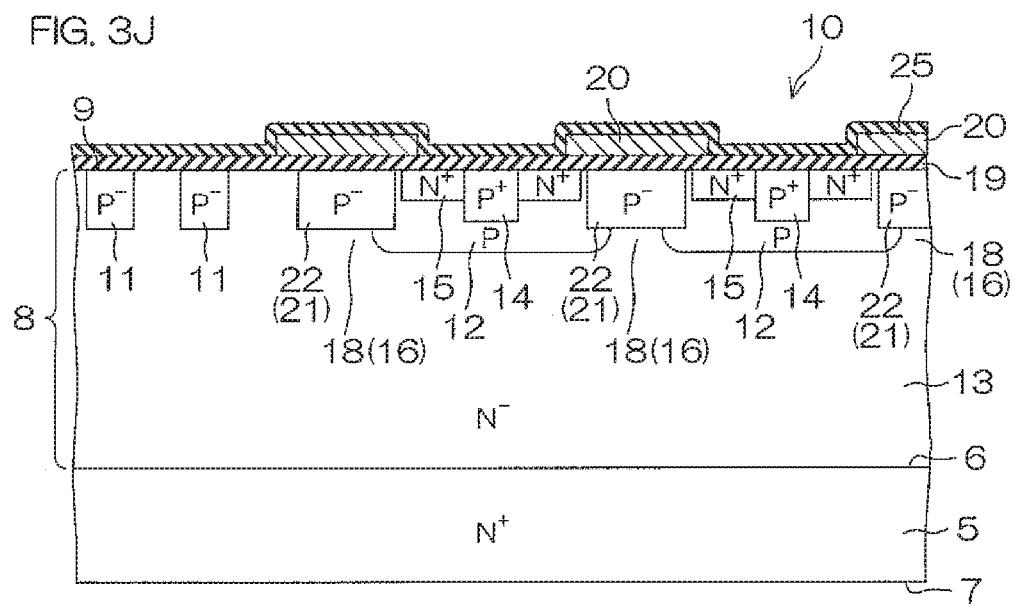
FIG. 3J is a diagram showing a step subsequent to FIG. 3I.

Then, the interlayer dielectric film 25 made of SiO$_2$ is stacked on the epitaxial layer 8 by CVD, as shown in FIG. 3J.

Then, the interlayer dielectric film 25 and the gate insulating 19 are so continuously patterned that the contact holes 26 are formed, as shown in FIG. 3K.

Thereafter Ti, TiN and Al are successively sputtered on the interlayer dielectric film 25 to form the source electrode 27, for example. Further, Ti, Ni, Au and Ag are successively sputtered on the back surface 7 of the SiC substrate 5, so that the drain electrode 30 is formed.

Thereafter the interlayer insulating film (not shown), the source pad 2, the gate pad 4 and the like are formed, whereby the semiconductor device 1 shown in FIG. 2B is obtained.

In the semiconductor device 1, annular channels are formed in the peripheral edge portions of the body regions 12 of each unit cell by applying drain voltage between the source pad 2 (the source electrode 27) and the drain electrode 30 (between the source and the drain) and applying prescribed voltage (voltage of not more than gate threshold voltage) to the gate pad 4 (the gate electrode 20) in a state grounding the source pad 2 (i.e., the source electrode 27 is at 0 V). Thus, current flows from the drain electrode 30 to the source electrode 27, and each unit cell enters an ON-state.

When each unit cell is brought into an OFF-state (i.e., a state where the gate voltage is 0 V) and the voltage is kept being applied between the source and the drain, on the other hand, an electric field is applied to the gate insulating film 19 interposed between the gate electrode 20 and the epitaxial layer 8. The electric field results from the potential difference between the gate electrode 20 and the epitaxial layer 8. In the interbody regions 16 where the conductivity type (the n$^-$-type) of the drift region 13 is kept, equipotential surfaces of extremely high potential with reference (0 V) to the gate electrode 20 are distributed while intervals between the equipotential surfaces are small, whereby an extremely large electric field is generated. If the drain voltage is 900 V, for example, equipotential surfaces of 900 V are distributed around the back surface 7 of the SiC substrate 5 in contact with the drain electrode 30 and a voltage drop is caused from the back surface 7 of the Si substrate 5 toward the surface 9 of the epitaxial layer 8, while equipotential surfaces of about several 10 V are distributed in the interbody regions 16.

Therefore, an extremely large electric field directed toward the gate electrode 20 is generated in the interbody regions 16.

In the semiconductor device 1, however, the implantation region 21 of the reverse conductivity type (the p⁻-type) to the drift region 13 is formed over the whole areas of the interbody regions 16. Therefore, depletion layers resulting from junction (p-n junction) between the implantation region 21 and the drift region 13 can be generated on the whole areas of the interbody regions 16. The equipotential surfaces of high potential with reference to the gate electrode 20 can be lowered toward the side of SiC substrate 5 and separated from the gate insulating film 19, due to the presence of the depletion layers. Consequently, the electric field applied to the gate insulating film 19 can be reduced. Therefore, dielectric breakdown of the gate insulating film 19 can be suppressed in an HTRB test in which voltage approximate to the withstand voltage of the device is continuously applied between the source and the drain, and further in practical use. Therefore, the semiconductor device 1 excellent in withstand voltage can be manufactured with a high yield.

In such a structure that the body regions 12 are in the form of the matrix and the interbody regions 16 are formed in the latticed manner, a particularly strong electric field is easily generated in the intersectional region 18 surrounded by the respective corners of the four body regions 12 arrayed in two rows and two columns. In the semiconductor device 1, however, the implantation region 21 (the intersectional portion 22) larger than the intersectional region 18 is formed on the intersectional region 18, and the intersectional portion 22 enters the respective corners of the body regions 12. Therefore, dielectric breakdown of portions of the gate insulating film 19 opposed to the intersectional regions 18 can be effectively suppressed. Further, the implantation region 21 (the linear portions 23) is formed not only on the intersectional regions 18 but also on the line regions 17, whereby dielectric breakdown of portions of the gate insulating film 19 opposed to the line regions 17 can also be effectively suppressed. As a result of these, the electric field applied to the gate insulating film 19 can be uniformly relaxed.

Modifications of First Embodiment

While a plurality of modifications of the semiconductor device 1 according to the first embodiment are now illustrated, the modifications are not restricted to these.

For example, the implantation region 21 may be formed only on the line regions 17. Further, the implantation region 21 formed on the line regions 17 may not necessarily be linear, but may be in the form of a polygon such as a square or a triangle, for example.

Figure 4A:
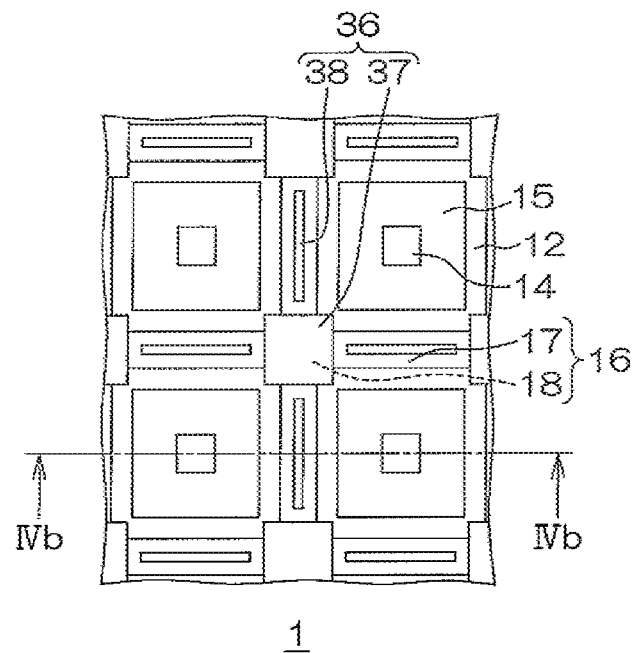
Figure 4B:
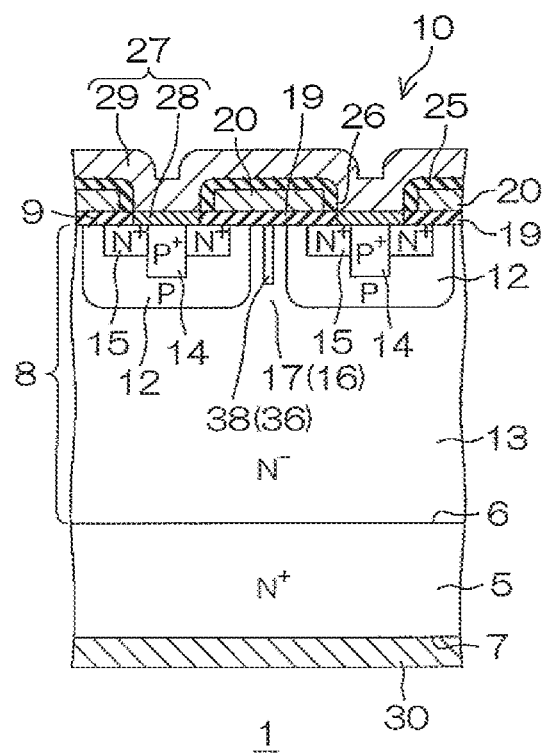

In the semiconductor device 1, the linear portions 23 of the implantation region 21 may not be integral with the intersectional portions 22, but linear portions 38 of an implantation region 36 may be so formed that both longitudinal ends thereof separate from respective sides of intersectional portions 37, as shown in FIG. 4A, for example.

Figure 5A:
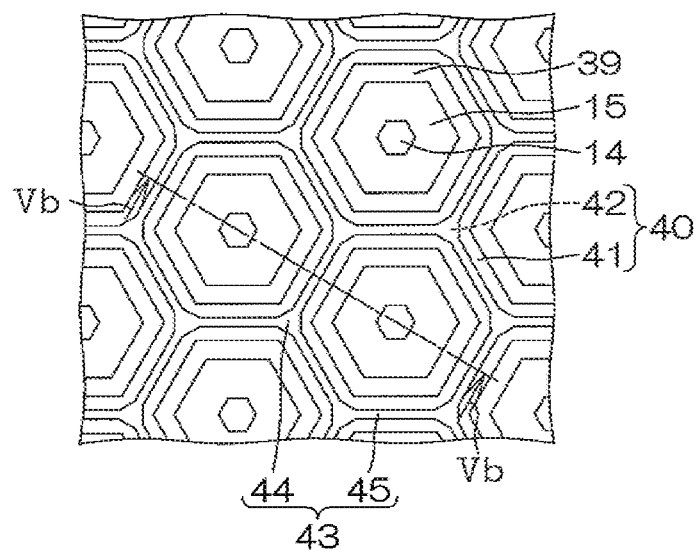
Figure 5B:
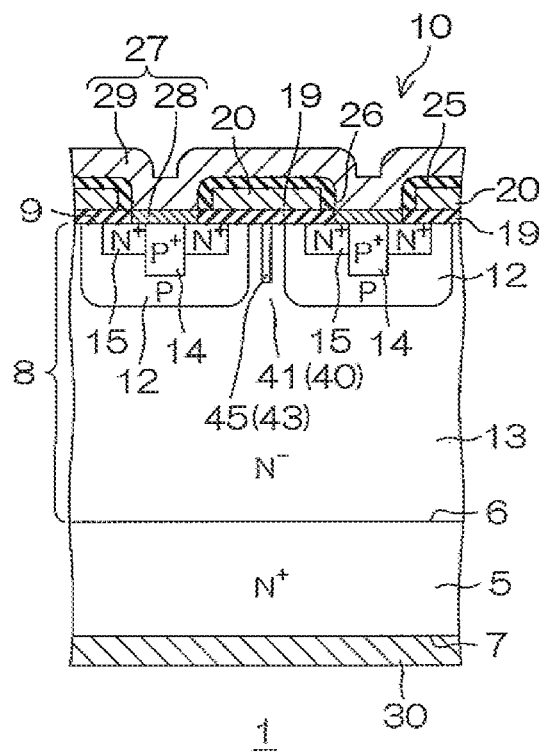

In the semiconductor device 1, the plane shape of the body regions 12 may not be square, but may be in the form of a regular hexagon, as in body regions 39 shown in FIG. 5A, for example.

An array pattern of the body regions 39 in this case is such a honeycomb pattern that the body regions 39 are so arrayed that single sides of adjacent body regions 39 are parallel to one another, for example.

Regions (interbody regions 40) between the respective ones of the body regions 39 arrayed in the honeycomb pattern are in the form of a honeycomb having a constant width. The interbody regions 40 include line regions 41 linearly extending between the respective ones of the adjacent body regions 39 along six side surfaces of each body region 39 and intersectional regions 42 where three line regions 41 radially intersect with one another.

An implantation region 43 is in the form of a honeycomb formed over the whole area of the honeycomb region, for example, and integrally includes intersectional portions 44 (portions formed on the intersectional regions 42) and linear portions 45 (portions formed on the line regions 41).

Figure 6:
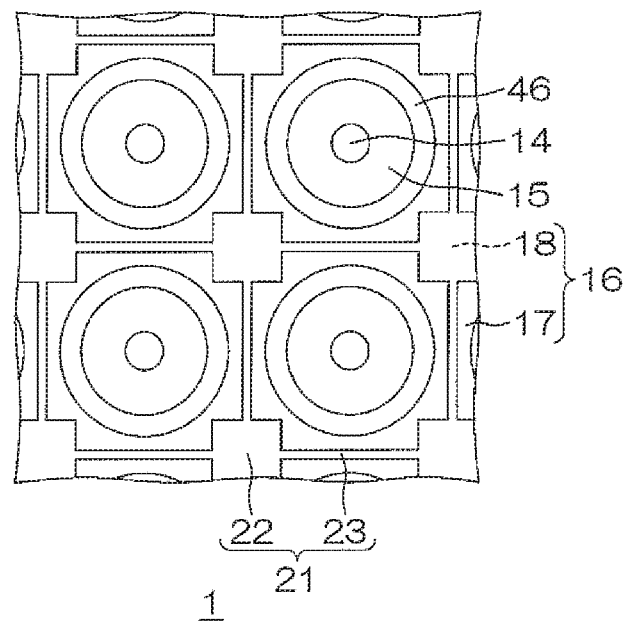
FIG. 6 is a schematic plan view for illustrating a third modification of the semiconductor device according to the first embodiment.

Further, the plane shape of the body regions 12 arrayed in the form of the matrix may be circular, as in body regions 46 shown in FIG. 6, for example.

Figure 7:
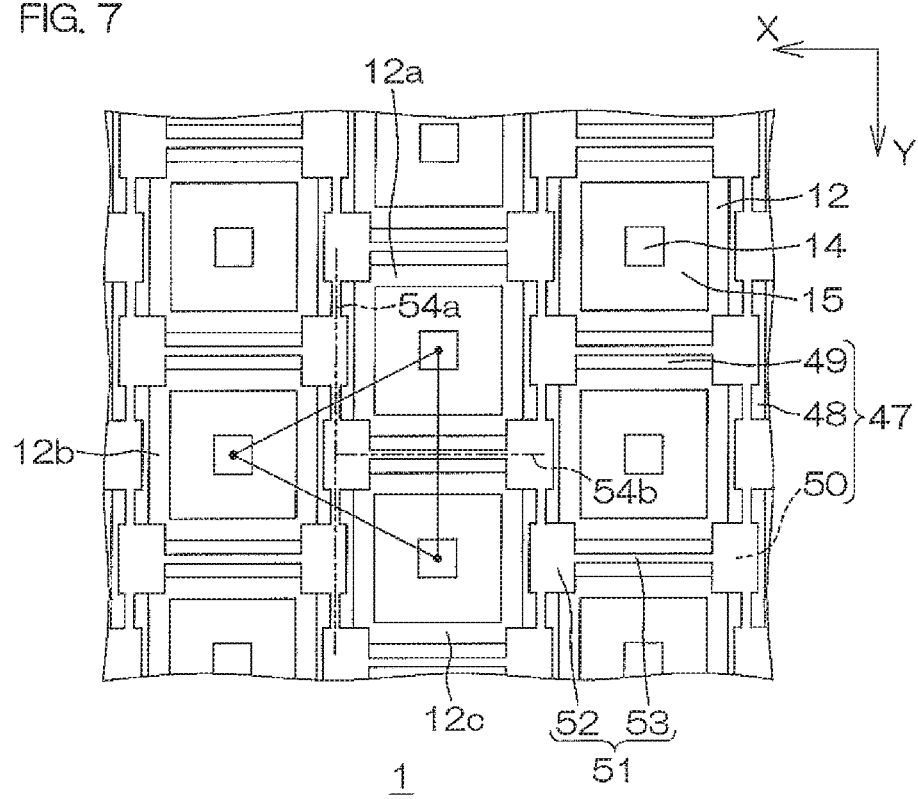
FIG. 7 is a schematic plan view for illustrating a fourth modification of the semiconductor device according to the first embodiment.

Further, the array pattern of the body regions 12 may not necessarily be the matrix pattern, but may be a zigzag array pattern, as shown in FIG. 7, for example. More specifically, body regions 12 square-shaped in plan view form a plurality of columns, and are arranged at a constant pitch in a column direction Y in each column. In two columns adjacent to each other in a row direction X orthogonal to the column direction Y, body regions 12 forming one of the columns and body regions 12 forming the other column have positional relation deviating from one another by half the pitch (half the pitch at which the body regions 12 are arranged in the column direction).

A region (an interbody region 47) between each pair of body regions 12 in the zigzag array pattern integrally includes a first line region 48 linearly extending between two adjacent columns of body regions 12 along the column direction Y, a second line region 49 linearly extending between the respective ones of the body regions 12 of each column along the row direction X, and an intersectional region 50 where the first line region 48 and the second line region 49 intersect with each other in a T-shaped manner.

An implantation region 51 is formed over the whole area of the interbody region 47, for example, and integrally includes an intersectional portion 52 (a portion formed on the intersectional region 50) and a linear portion 53 (a portion formed on the first line region 48 and the second line region 49).

In a case of noting three body regions 12 (body regions 12a to 12c in FIG. 7, for example) arranged on the positions of respective apexes of a triangle surrounding each T-shaped intersectional region 50 among the large number of body regions 12 arrayed in the zigzag array pattern and assuming two straight lines 54a and 54b extending between the adjacent body regions 12a and 12b and the adjacent body regions 12b and 12c respectively, it can be said that the intersectional portion 52 is provided on the intersection point (i.e., a point on the intersection point of a T-shaped path) between the two straight lines 54a and 54b.

Figure 8A:
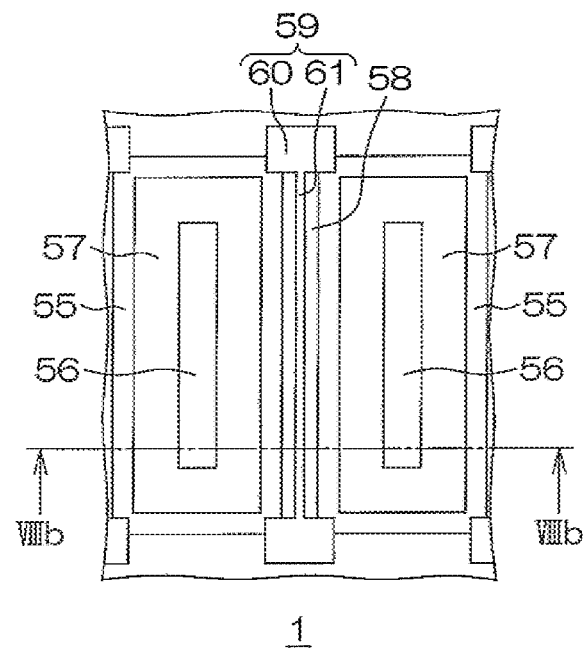
Figure 8B:
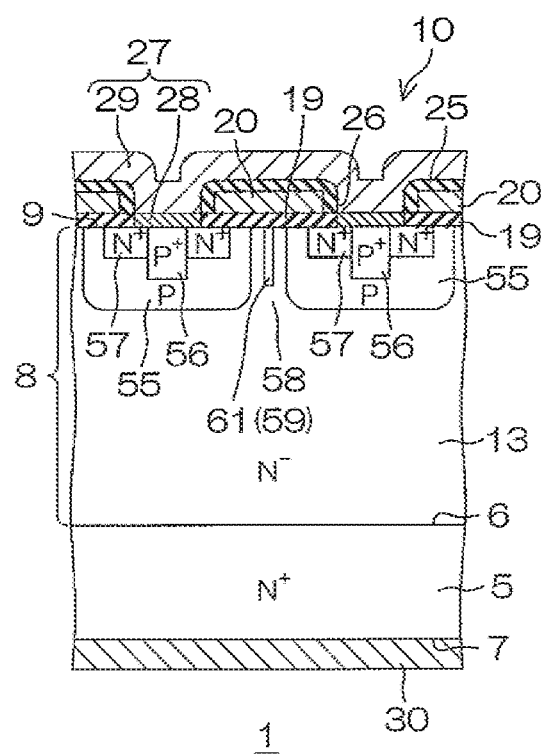

The plane shape of the body regions 12 may be an elongational shape. For example, the plane shape may be oblong, as in body regions 55 shown in FIGS. 8A and 8B.

The oblong body regions 55 are arrayed at a constant pitch so that the long sides of body regions 55 adjacent to each other are parallel to each other, for example. In a surface layer portion of each body region 55, a body contact region 56 is formed on a central portion thereof, and a source region 57 is formed to surround the body contact region 56. The body contact region 56 has an oblong shape similar to that of the body region 55 in plan view. On the other hand, the source region 57 is in the form of a rectangular ring in plan view.

Regions (interbody regions 58) between the respective ones of the body regions 55 arrayed in this manner are in the form of lines linearly extending between the respective ones along the longitudinal direction of the body regions 55.

One implantation region 59 is provided every linear interbody region 58, and in the form of a straight line along the longitudinal direction. Each implantation region 59 includes a pair of end portions 60 formed on both longitudinal end portions thereof and a linear portion 61 linking the pair of end portion regions with each other.

Each end portion 60 of the implantation region 59 is in the form of a rectangle in plan view, and two corners thereof closer to the body region 55 enter corners of the body region 55 respectively. On the other hand, the linear portion 61 is formed with a constant width at an interval from a side surface of the body region 55.

The plane shape of the elongational body regions 12 may be a shape partitioned by meandering lines each formed by coupling a plurality of arcuate portions 63 with one another, as in body regions 62 shown in FIG. 9, for example. In this case, two body contact regions 56 may be formed on each body region 62 at an interval from each other in the longitudinal direction of the body regions 62.

The plane shape of the elongational body regions 12 may be a shape partitioned by meandering lines each formed by coupling a plurality of bent portions 65 with one another, as in body regions 64 shown in FIG. 10, for example. Each bent portion 65 has a shape bent toward one side in the width direction at an interior angle of 120 degrees with respect to a portion extending in the longitudinal direction of the body regions 64, extending in the longitudinal direction, and bent toward another side in the width direction at an interior angle of 120 degrees with respect to the portion extending in the longitudinal direction. Also in this case, two body contact regions 14 may be formed on each body region 64 at an interval from each other in the longitudinal direction of the body region 64.

Figure 11A:
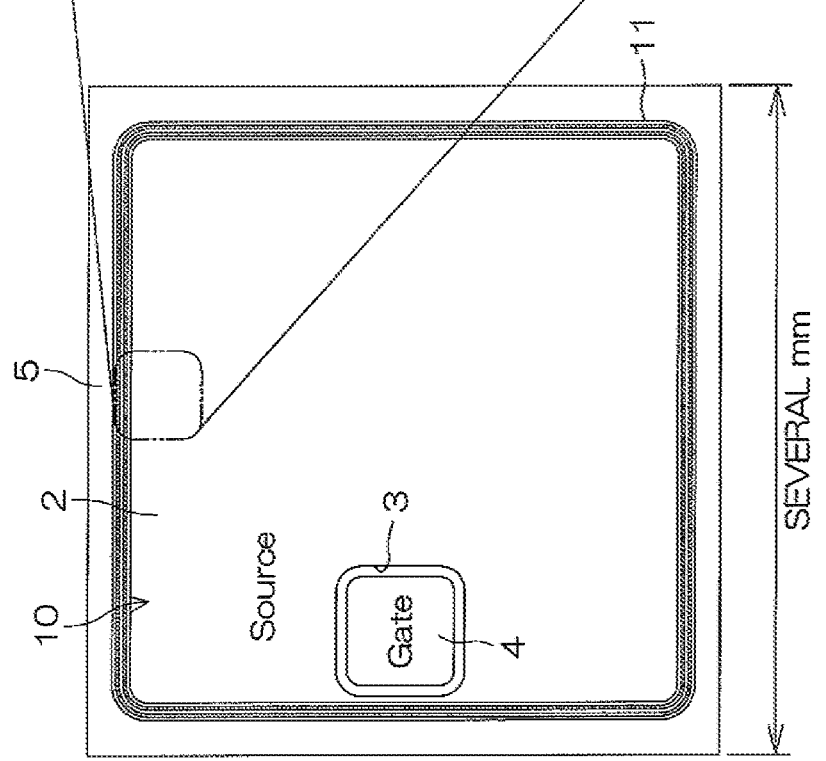
Figure 11B:
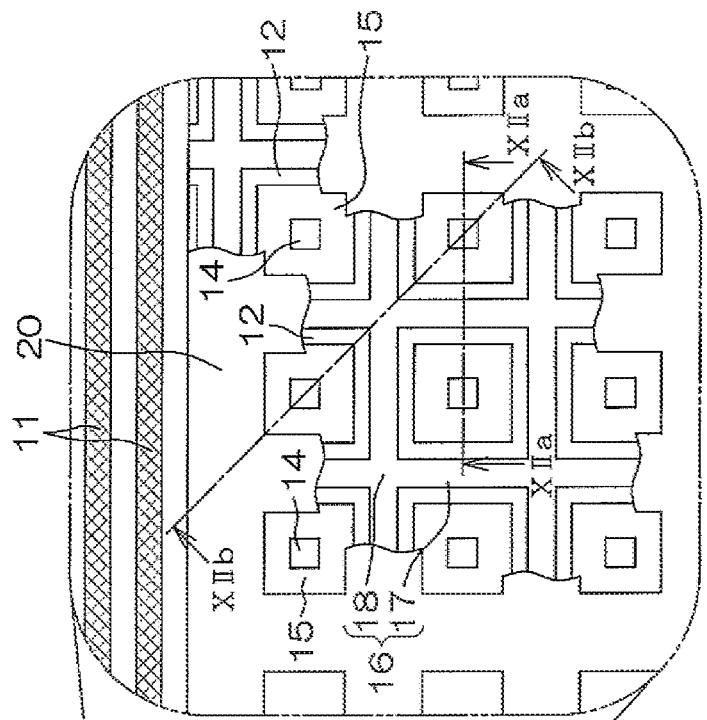
Figure 12B:
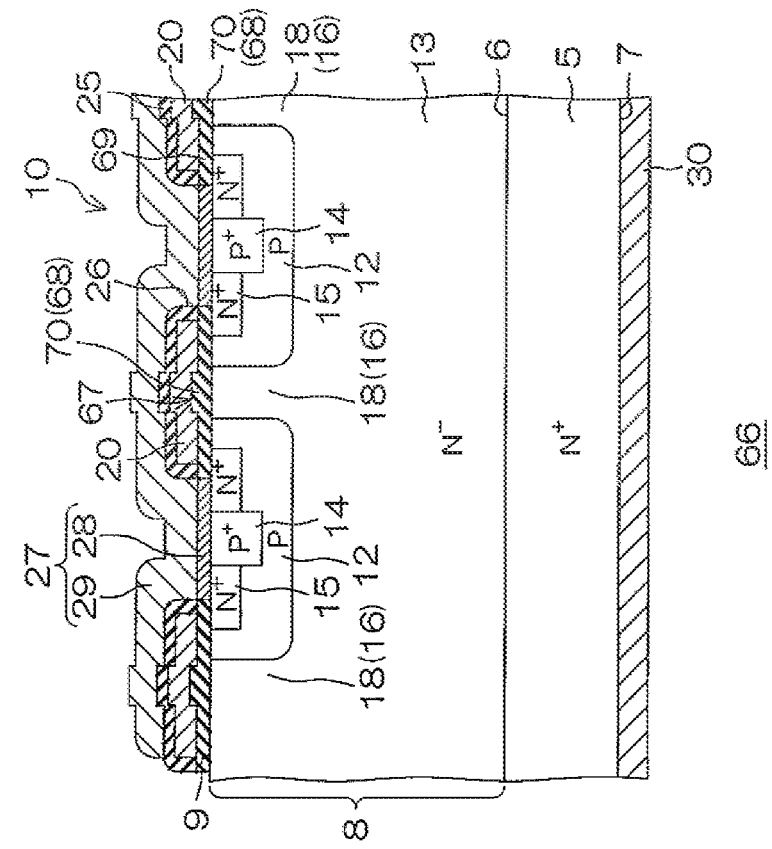
Figure 12A:
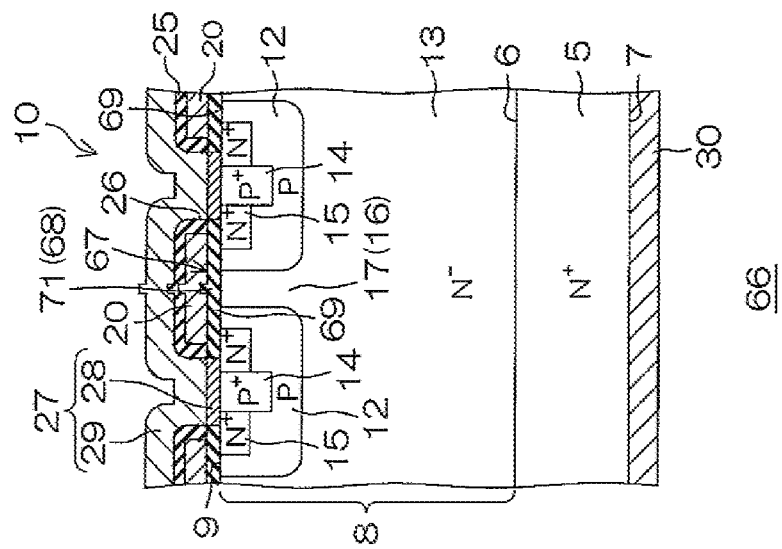

Second Embodiment: Field Relaxation by Partial Thickening of Gate Insulating Film FIGS. 11A and 11B are schematic plan views of a semiconductor device according to a second embodiment of the present invention, while FIG. 11A shows a general diagram and FIG. 11B shows an enlarged internal diagram respectively. FIGS. 12A and 12B are schematic sectional views of the semiconductor device according to the second embodiment of the present invention, while FIG. 12A shows a cutting plane along a cutting plane line XIIa-XIIa in FIG. 11B and FIG. 12B shows a cutting plane along a cutting plane line XIIb-XIIb in FIG. 11B respectively. Referring to FIGS. 11A and 11B and FIGS. 12A and 12B, portions corresponding to the respective portions shown in the aforementioned FIG. 1 and the like are denoted by the same reference signs.

In a semiconductor device 66 according to the second embodiment, the thickness of a gate insulating film is not uniform, but the gate insulating film 67 integrally includes a relatively thick thick-film portion 68 as a field relaxation portion opposed to latticed interbody regions 16 and a relatively thin thin-film portion 69 opposed to body regions 12 surrounded by sides of the lattice of the interbody regions 16.

The thick-film portion 68 is in the form of a lattice surrounding the body regions 12 in plan view along the interbody regions 16, and integrally includes intersectional portions 70 opposed to intersectional regions 18 and linear portions 71 as linear field relaxation portions opposed to line regions 17. The thickness of the thick-film portion 68 is 1000 Å to 3000 Å, for example.

Each intersectional portion 70 is in the form of a square slightly smaller than the intersectional region 18 in plan view, and respective corners thereof are opposed to corners of four body regions 12 facing the intersectional region 18 at intervals respectively. The intersectional region 70 may overlap with the body region 12 in plan view.

Each linear portion 71 is in the form of a straight line linking centers of respective sides of intersectional portions 70 adjacent to each other in plan view, and at an interval not to overlap with a peripheral edge portion of the body region 12.

The thin-film portion 69 extends from the latticed thick-film portion 68 surrounding the body regions 12 in plan view toward the side of the body regions 12 with a constant width, and covers the peripheral edge portions of the body regions 12 and outer peripheral edges of source regions. The thickness of the thin-film portion 69 is 350 Å to 1000 Å, for example.

The remaining structure is similar to the case of the aforementioned first embodiment.

FIGS. 13A to 13K are schematic sectional views for illustrating a method of manufacturing the semiconductor device shown in FIG. 12B.

In order to manufacture the semiconductor device 66 according to the second embodiment, steps similar to the steps shown in FIGS. 3A to 3F (on condition that no implantation region 21 is formed in the step shown in FIG. 3E) are carried out so that the body regions 12, source regions 15 and body contact regions 14 are formed on an epitaxial layer 8 as shown in FIGS. 13A to 13E, for example, and impurities implanted into these regions are activated by heat treatment.

Figure 13A:
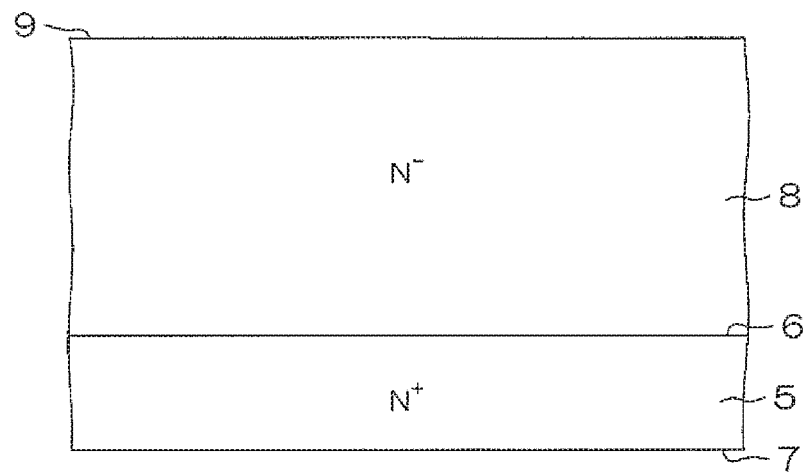
FIG. 13A is a schematic sectional view for illustrating a method of manufacturing the semiconductor device shown in FIG. 12B.
Figure 13B:
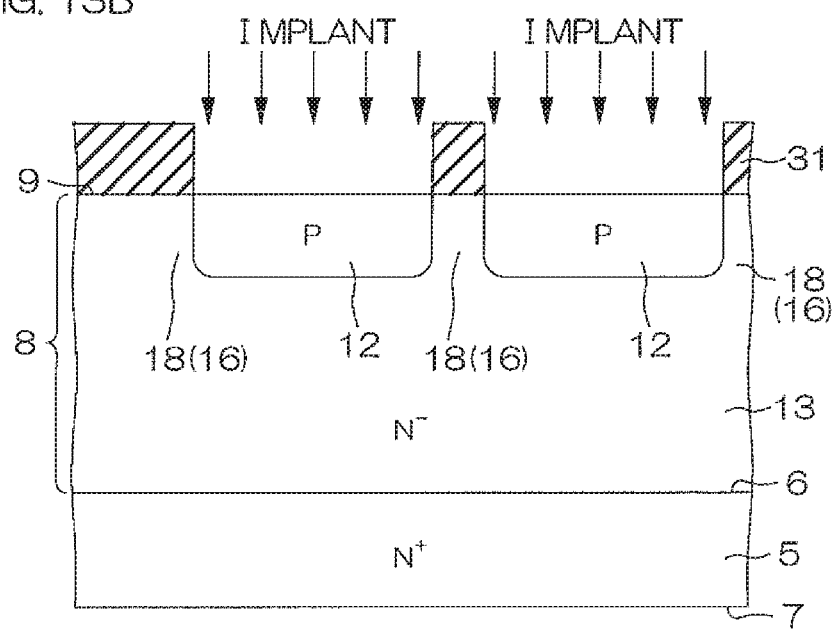
FIG. 13B is a diagram showing a step subsequent to FIG. 13A.
Figure 13E:
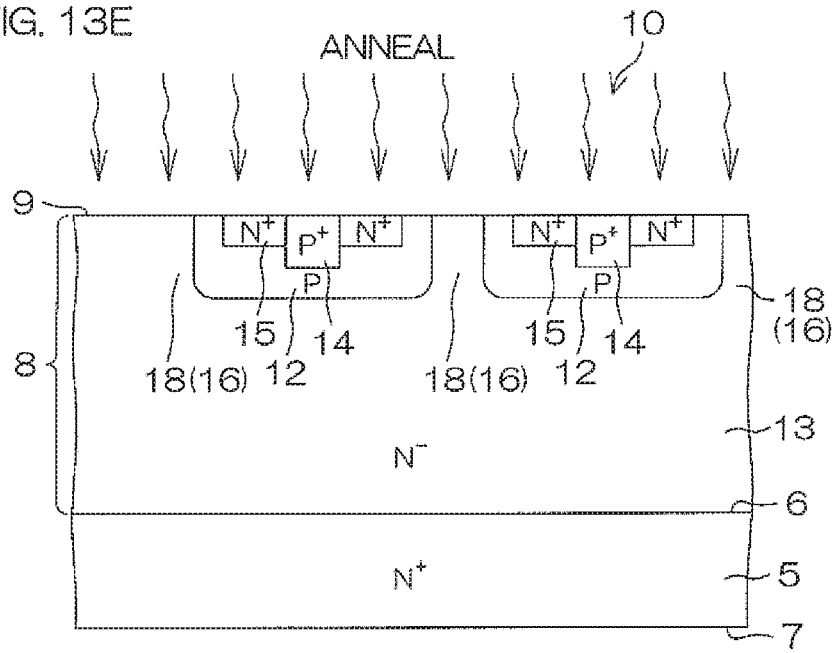
FIG. 13E is a diagram showing a step subsequent to FIG. 13D.
Figure 13F:
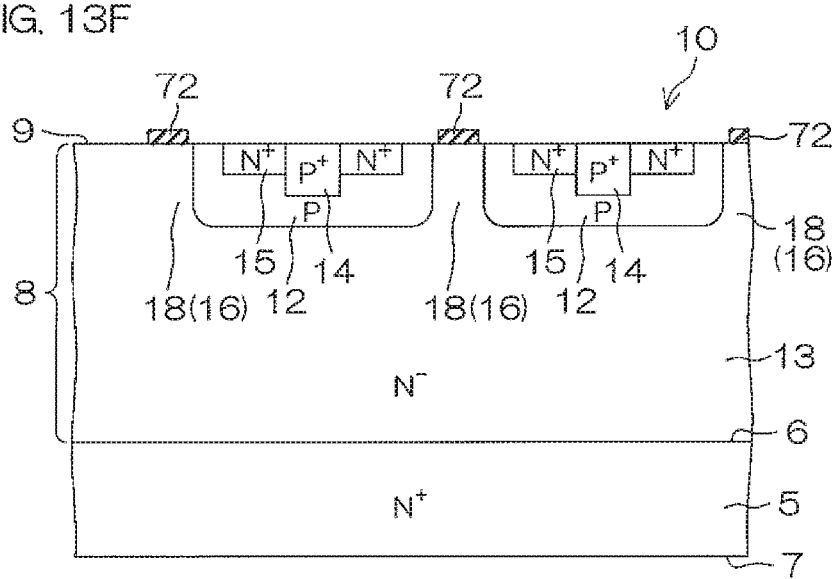
FIG. 13F is a diagram showing a step subsequent to FIG. 13E.

Then, a mask (not shown) having openings in regions (regions opposed to the interbody regions 16) for forming the thick-film portion 68 is formed on a surface 9 of the epitaxial layer 8. Thus, oxide films 72 are formed only on the regions for forming the thick-film portion 68, as shown in FIG. 13F.

Figure 13G:
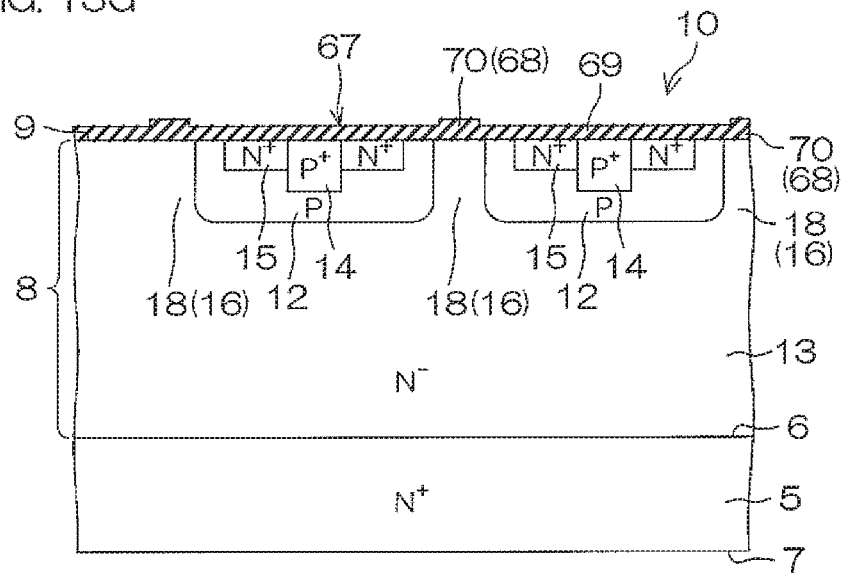
FIG. 13G is a diagram showing a step subsequent to FIG. 13F.
Figure 13H:
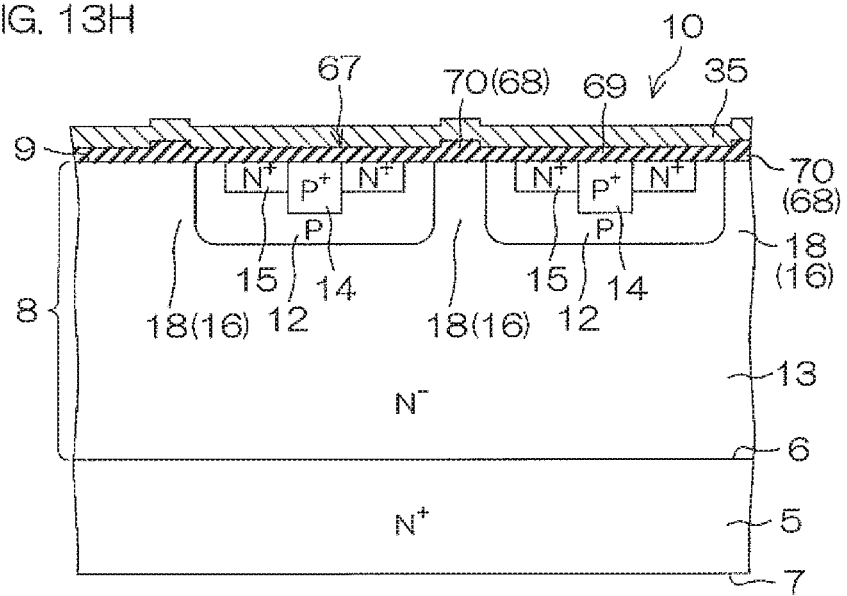
FIG. 13H is a diagram showing a step subsequent to FIG. 13G.
Figure 13:
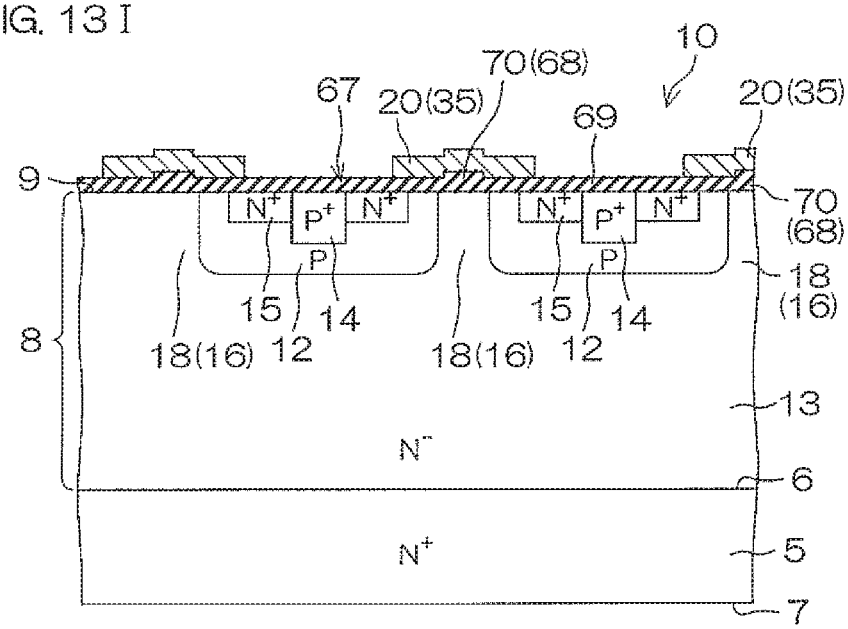
FIG. 13C is a diagram showing a step subsequent to FIG. 13B.
FIG. 13D is a diagram showing a step subsequent to FIG. 13C.
FIG. 13I is a diagram showing a step subsequent to FIG. 13H.
FIG. 13J is a diagram showing a step subsequent to FIG. 13I.
FIG. 13K is a diagram showing a step subsequent to FIG. 13J.
Figure 13J:
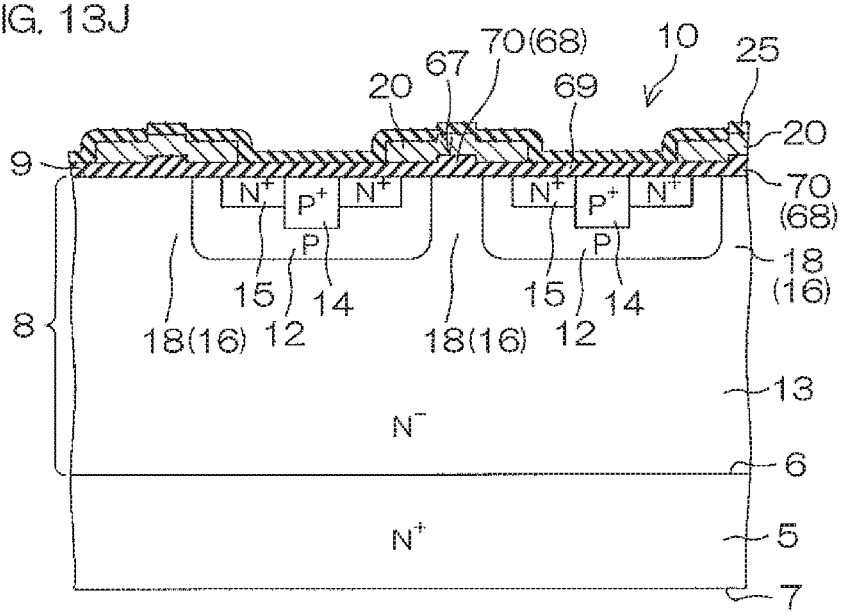
Figure 13K:
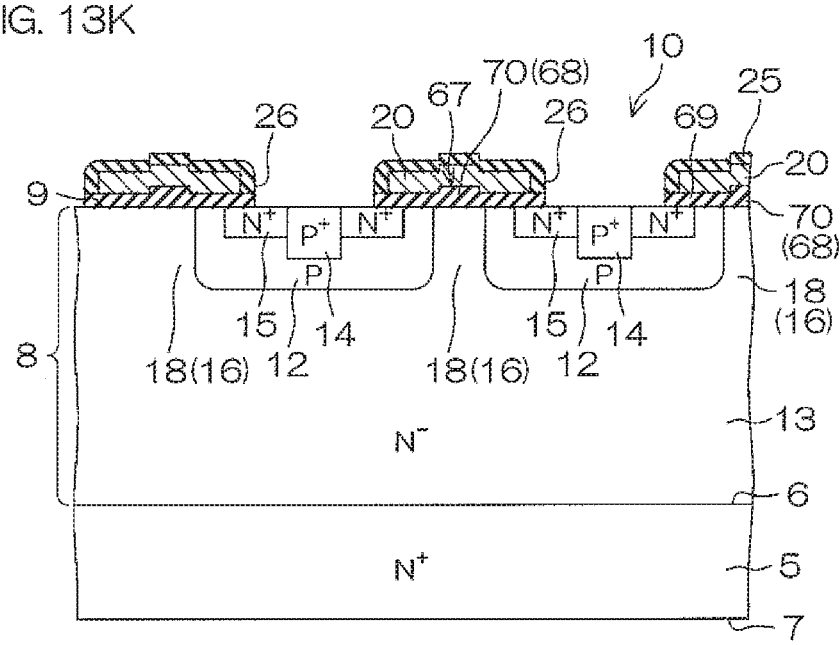

The surface 9 of the epitaxial layer 8 is thermally oxidized in the state where the oxide films 72 are formed, whereby the portions where the oxide films 72 are formed are so relatively thickened that the thick-film portion 68 is formed while the thin-film portion 69 is so formed on the remaining portions that the gate insulating film 67 is formed, as shown in FIG. 13G.

Thereafter steps similar to the steps shown in FIGS. 3H to 3K are carried out as shown in FIGS. 13H to 13K, so that a gate electrode 20 and an interlayer dielectric film 25 are formed on the gate insulating film 67. Thereafter a source electrode 27, a drain electrode 30, a source pad 2 and a gate pad 4 etc. are formed, whereby the semiconductor device 66 shown in FIG. 12B is obtained.

In the semiconductor device 66, annular channels are formed in the peripheral edge portions of the body regions 12 of each unit cell by applying drain voltage between the source pad 2 (the source electrode 27) and the drain electrode 30 (between a source and a drain) and applying prescribed voltage (voltage of not less than gate threshold voltage) to the gate pad 4 (the gate electrode 20) in a state grounding the source pad 2 (i.e., the source electrode 27 is at 0 V). Thus, current flows from the drain electrode 30 to the source electrode 27, and each unit cell enters an ON-state.

When each unit cell is brought into an OFF-state (i.e., a state where gate voltage is 0 V) and the voltage is kept being applied between the source and the drain, on the other hand, an electric field is applied to the gate insulating film 67 interposed between the gate electrode 20 and the epitaxial layer 8. The electric field results from potential difference between the gate electrode 20 and the epitaxial layer 8. In the interbody regions 16 where the conductivity type (n⁻-type) of a drift region 13 is maintained, equipotential surfaces of extremely high potential with reference (0 V) to the gate electrode 20 are distributed and the intervals between the equipotential surfaces are small, whereby an extremely large electric field is generated. If the drain voltage is 900 V, for example, equipotential surfaces of 900 V are distributed around a back surface 7 of an SiC substrate 5 in contact with the drain electrode 30 and a voltage drop is caused from the back surface 7 of the Si substrate 5 toward the surface 9 of the epitaxial layer 8, while equipotential surfaces of about several 10 V are distributed in the interbody regions 16. Therefore, a large electric field directed toward the gate electrode 20 is generated in the interbody regions 16.

In the semiconductor device 66, however, the portion opposed to the interbody regions 16 is increased in thickness as the thick-film portion 68 in the gate insulating film 67. Thus, dielectric breakdown voltage of the portion (the thick-film portion 68) can be rendered greater than that of the remaining portion (the thin-film portion 69). Even if a large electric field is applied to the thick-film portion 68, therefore, the thick-film portion 68 does not dielectrically break down, but can relax the applied electric field therein. Therefore, dielectric breakdown of the gate insulating film 19 can be suppressed in an HTRB test in which voltage approximate to the withstand voltage of the device is continuously applied between the source and the drain and further in practical use. Therefore, the semiconductor device 66 excellent in withstand voltage can be manufactured with a high yield.

Further, the thick-film portion 68 (the intersectional portions 70) is formed on the portion opposed to the intersectional regions 18 where a particularly strong electric field is easily generated. Therefore, dielectric breakdown of the portion of the gate insulating film 67 opposed to the intersectional regions 18 can be effectively suppressed. In addition, the thick-film portion 68 (the linear portions 71) is formed not only on the portion opposed to the intersectional regions 18 but also on a portion opposed to the line regions 17, whereby dielectric breakdown of the portion of the gate insulating film 67 opposed to the line regions 17 can also be effectively suppressed. Consequently, the electric field applied to the gate insulating film 67 can be uniformly relaxed.

On the other hand, a portion of the gate insulating film 67 opposed to the peripheral edge portions of the body regions 12 is the thin-film portion 69, whereby the electric field generated by applying the voltage to the gate electrode 20 in order to form the channels in the peripheral edge portions of the body regions 12 can be inhibited from weakening in the gate insulating film 67. Therefore, reduction of a transistor function of the semiconductor device 66 can be suppressed.

Modifications of Second Embodiment

While a plurality of modifications of the semiconductor device 66 according to the second embodiment are illustrated, modifications are not restricted to these.

Also in the semiconductor device 66, the plane shape of the body regions 12 and the array pattern of the body regions 12 can be properly changed. While illustration is omitted, the plane shape of the body regions 12 may be in the form of a regular hexagon, a circle or an oblong, for example. Further, the array pattern of the body regions 12 may be a honeycomb pattern, a zigzag array pattern or the like.

While the thick-film portion 68 has been formed by CVD by depositing an insulating material only on the interbody regions 16 after thermally oxidizing the surface 9 of the epitaxial layer 8 in the above description, the thick-film portion 68 can also be formed by forming an insulating film on the whole area of the surface 9 of the epitaxial layer 8 by thermal oxidation so that the film thickness is greater than a normal one and thereafter etching only the portion (the region for forming the thin-film portion 69) other than the region for forming the thick-film portion 68, for example.

The thick-film portion 68 can also be formed by rendering the impurity concentration in the interbody regions 16 of the epitaxial layer 8 greater than the concentration in the remaining portion and increasing only the rate of oxidation in the interbody regions 16. Thus, only the insulating film on the interbody regions 16 can be rapidly grown to be increased in thickness while the remaining portion can be slowly grown to be reduced in thickness, whereby the thick-film portion 68 and the thin-film portion 69 can be formed through only one thermal oxidation step.

Third Embodiment: Field Relaxation by Partial Removal of Gate Electrode

Figure 15A:
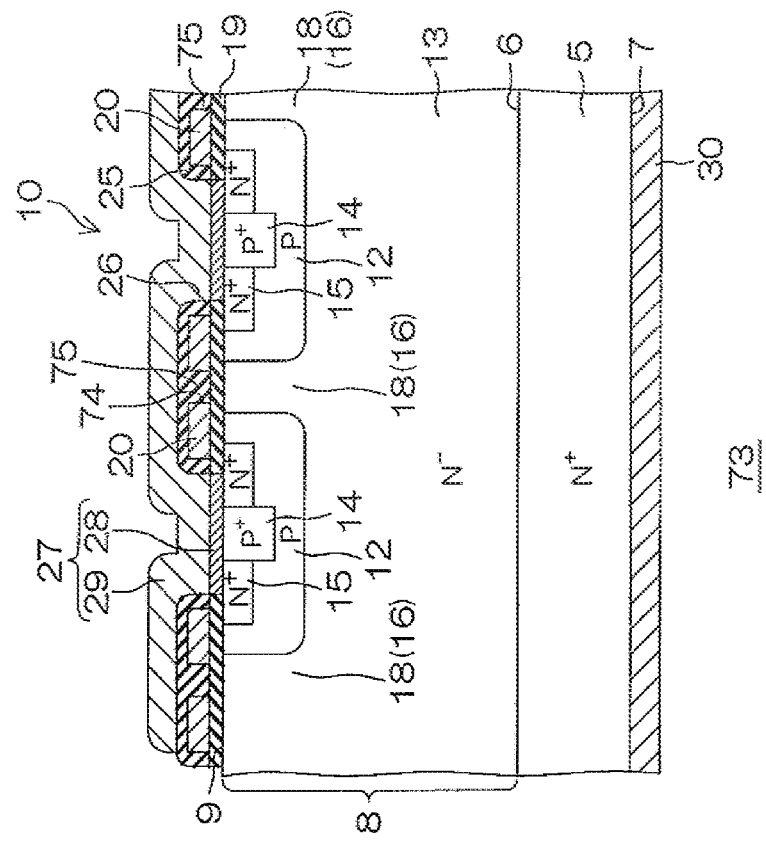
Figure 15B:
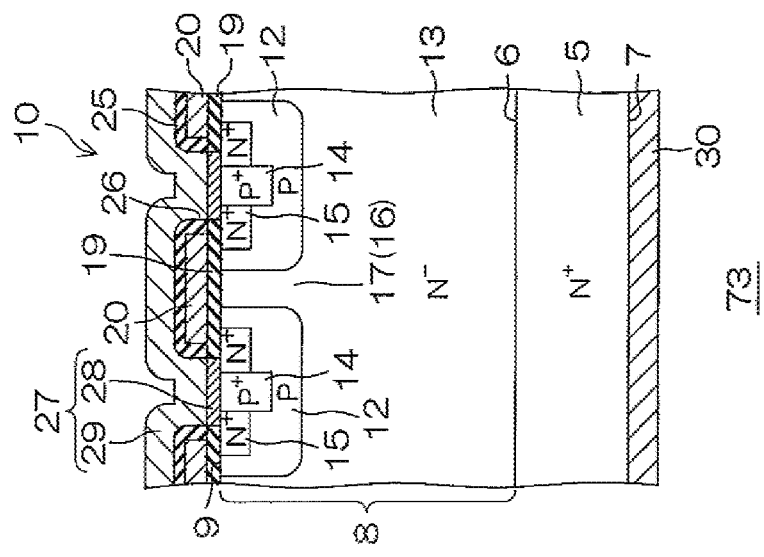

FIGS. 14A and 14B are schematic plan views of a semiconductor device according to a third embodiment of the present invention, while FIG. 14A shows a general diagram and FIG. 14B shows an enlarged internal diagram respectively. FIGS. 15A and 15B are schematic sectional views of the semiconductor device according to the third embodiment of the present invention, while FIG. 15A shows a cutting plane line along a cutting plane line XVa-XVa in FIG. 14B and FIG. 15B shows a cutting plane along a cutting plane line XVb-XVb in FIG. 14B respectively. Referring to FIGS. 14A and 14B and FIGS. 15A and 15B, portions corresponding to the respective portions shown in the aforementioned FIG. 1 and the like are denoted by the same reference signs.

In a semiconductor device 73 according to the third embodiment, a large number of through-holes 74 are formed in a gate electrode 20 by removing portions of the gate electrode 20 opposed to respective intersectional regions 18 of interbody regions 16.

More specifically, each through-hole 74 is in the form of a square having sides smaller than the width of the gate electrode 20 on each intersectional portion of the latticed gate electrode 20 having a constant width in plan view. The lattice of the gate electrode 20 can be rendered continuous without cutting the same around the through-hole 74 by reducing each side of the through-hole 74 below the width of the gate electrode 20.

In a case of noting three body regions 12 (body regions 12a to 12c in FIG. 14B, for example) arranged on the positions of respective apexes of a triangle among a large number of body regions 12 arrayed in the form of a matrix and assuming three straight lines 24a to 24c extending between the respective ones of the adjacent body regions 12a to 12c, it can be said that the through-hole 74 is provided on the intersection point between the two straight lines 24a and 24b (may be the intersection point between 24a and 24c or the intersection point between 24b and 24c) among these straight lines.

An interlayer dielectric film 25 covering the gate electrode 20 enters each through-hole 74 as an embedded portion 75. It follows that the embedded portion 75 is opposed to an intersectional region 18 of an interbody region 16 through a gate insulating film 19.

The remaining structure is similar to the case of the aforementioned first embodiment.

FIGS. 16A to 16K are schematic sectional views for illustrating a method of manufacturing the semiconductor device shown in FIG. 15B.

In order to manufacture the semiconductor device 73 according to the third embodiment, steps similar to the steps shown in FIGS. 3A to 3G (on condition that no implantation region 21 is formed in the step shown in FIG. 3E) are carried out so that the body regions 12, source regions 15 and body contact regions 14 are formed on an epitaxial layer 8 as shown in FIGS. 16A to 16F, for example, and impurities implanted into these regions are activated by heat treatment so that the gate insulating film 19 is formed.

Figure 16A:
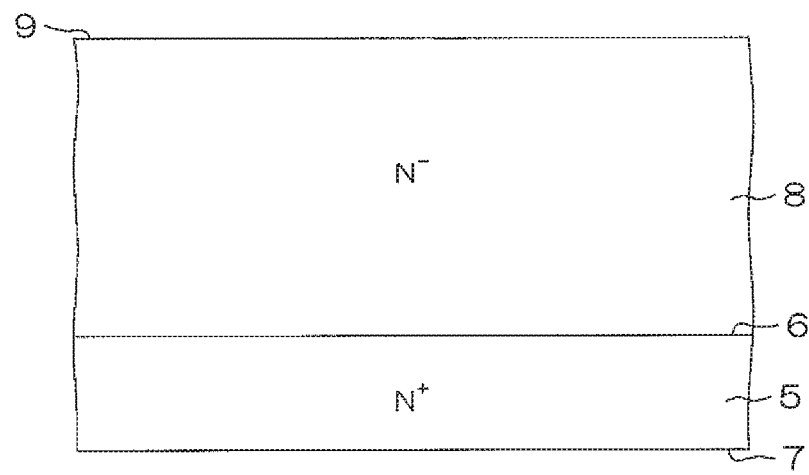
FIG. 16A is a schematic sectional view for illustrating a method of manufacturing the semiconductor device shown in FIG. 15B.
Figure 16B:
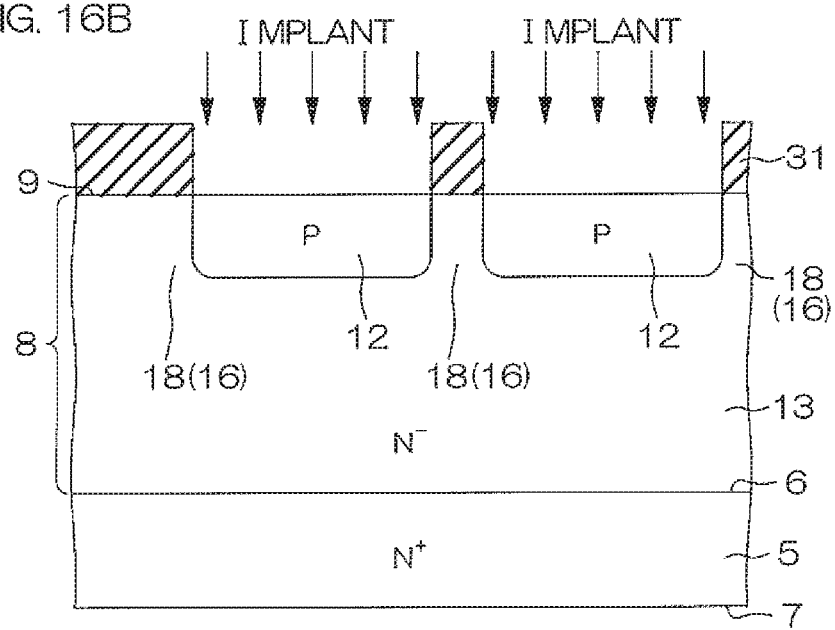
FIG. 16B is a diagram showing a step subsequent to FIG. 16A.
Figure 16E:
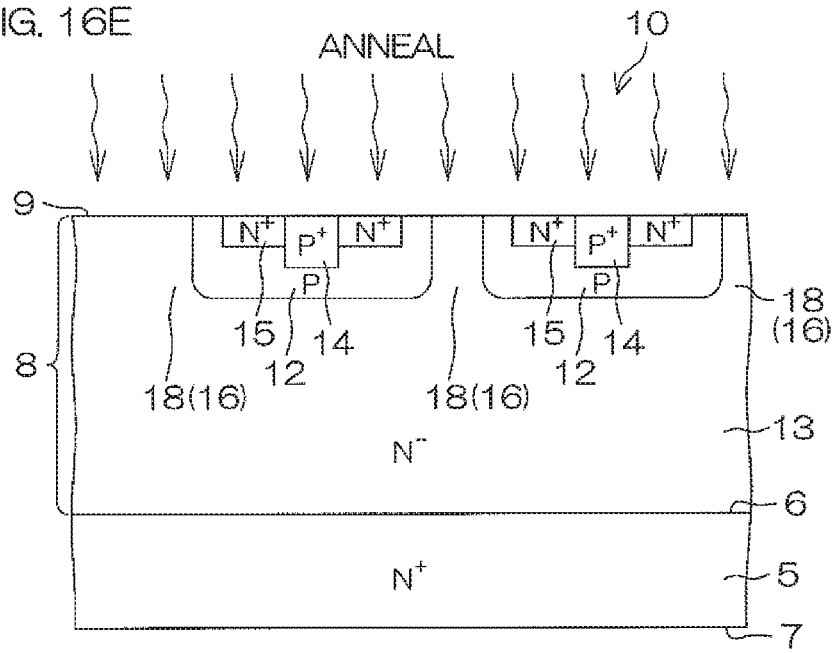
FIG. 16E is a diagram showing a step subsequent to FIG. 16D.
Figure 16F:
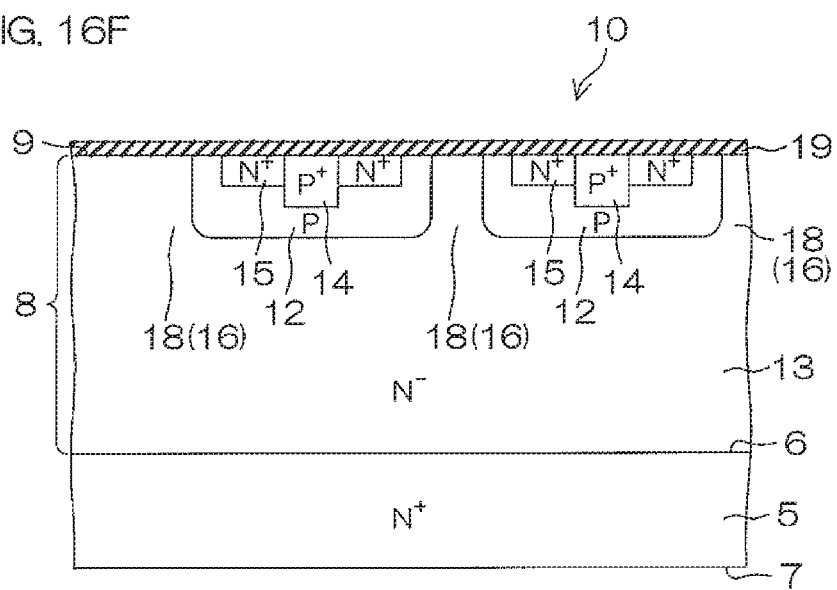
FIG. 16F is a diagram showing a step subsequent to FIG. 16E.
Figure 16G:
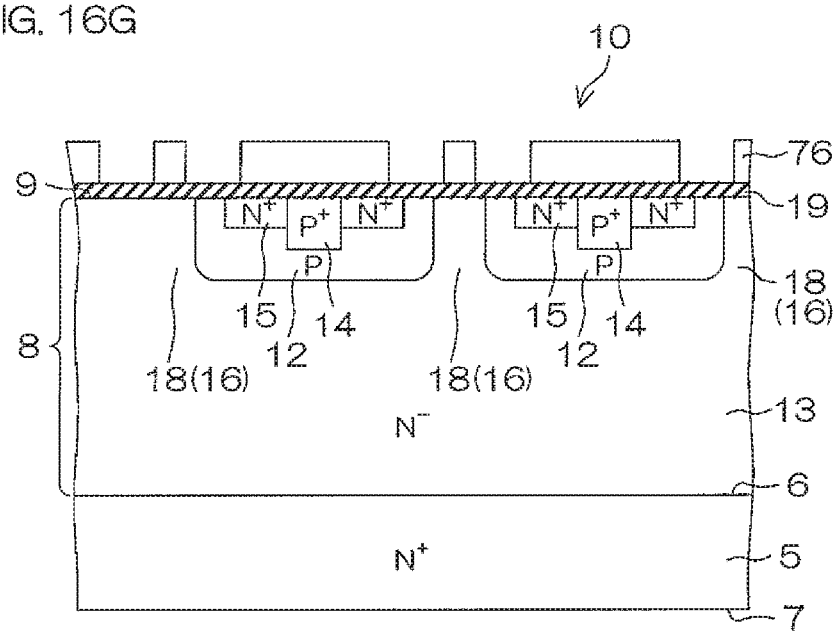
FIG. 16G is a diagram showing a step subsequent to FIG. 16F.

Then, a resist pattern 76 having openings in regions for forming the gate electrode 20 is formed, as shown in FIG. 16G. At this time, regions for forming the through-holes 74 are covered with the resist pattern 76.

Figure 16H:
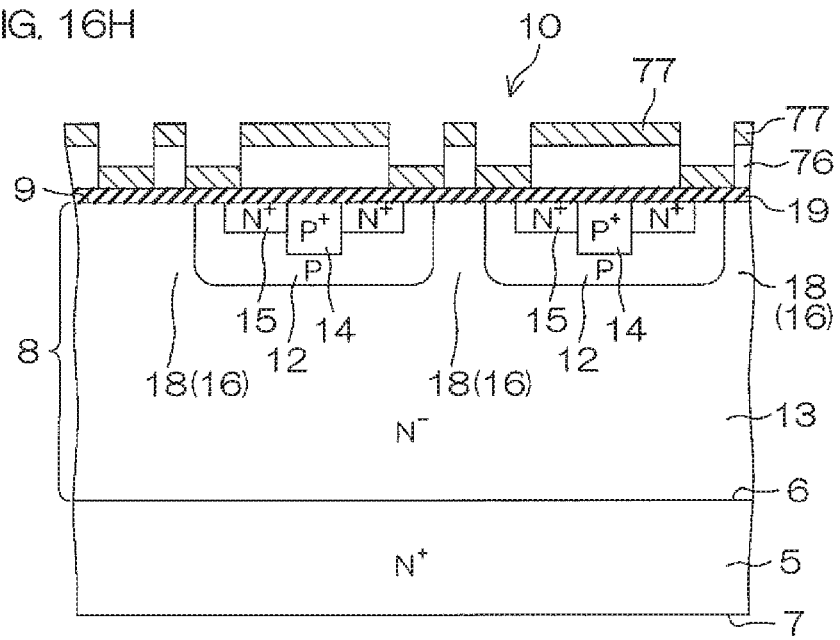
FIG. 16H is a diagram showing a step subsequent to FIG. 16G.
Figure 16:
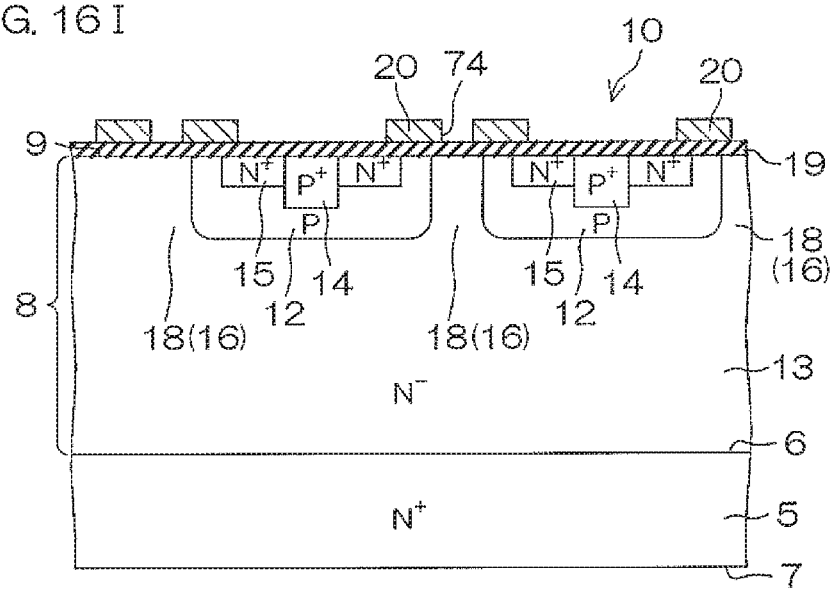
FIG. 16C is a diagram showing a step subsequent to FIG. 16B.
FIG. 16D is a diagram showing a step subsequent to FIG. 16C.
FIG. 16I is a diagram showing a step subsequent to FIG. 16H.
FIG. 16J is a diagram showing a step subsequent to FIG. 16I.
FIG. 16K is a diagram showing a step subsequent to FIG. 16J.
Figure 16:
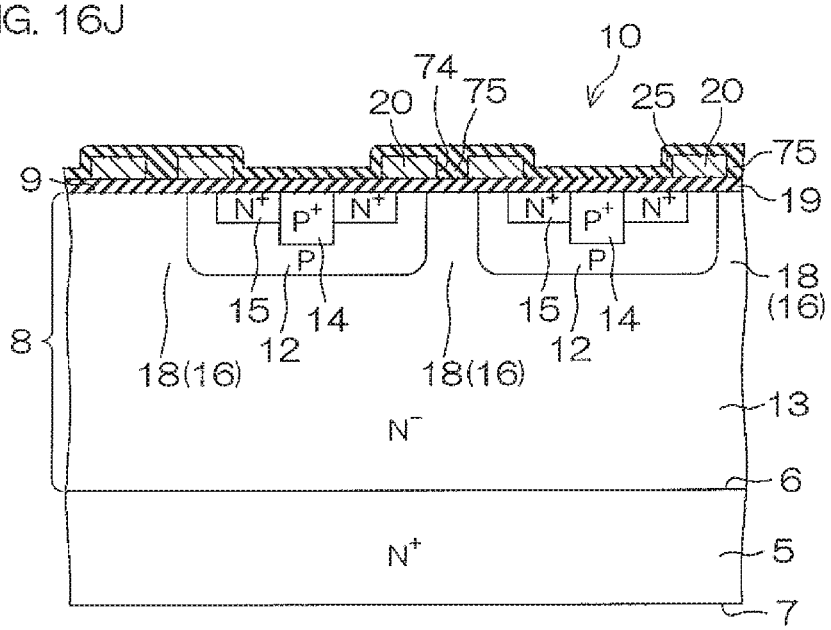

Then, a polysilicon material 77 is deposited from above the epitaxial layer 8 by CVD while introducing a p-type impurity (B (boron) in this embodiment), as shown in FIG. 16H.

Then, the resist pattern 76 is so removed that unnecessary portions (portions other than the gate electrode 20) of the polysilicon material 77 are lifted off along with the resist pattern 76, as shown in FIG. 16I. Thus, the gate electrode 20 having the through-holes 74 is formed.

Then, an interlayer dielectric film 25 made of $SiO_2$ is formed on the epitaxial layer 8 by CVD, as shown in FIG. 16J. The interlayer dielectric film 25 is partially embedded in the through-holes 74 of the gate electrode 20.

Figure 16K:
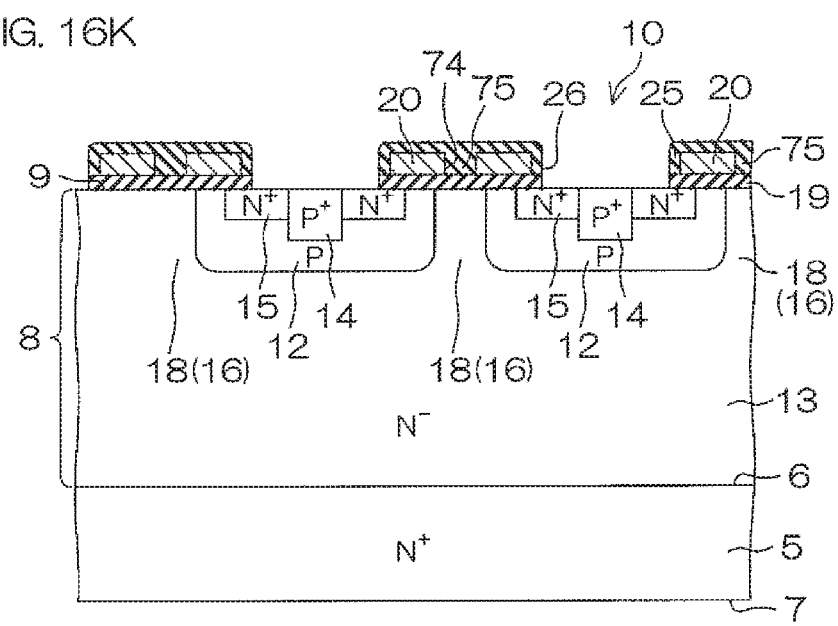

Then, the interlayer dielectric film 25 and the gate insulating film 19 are so continuously patterned that contact holes 26 are formed, as shown in FIG. 16K.

Thereafter Ti, TiN and Al are successively sputtered on the interlayer dielectric film 25 so that a source electrode 27 is formed, for example. Further, Ti, Ni, Au and Ag are successively sputtered on a back surface 7 of an SiC substrate 5, so that a drain electrode 30 is formed.

Thereafter an interlayer dielectric film (not shown), a source pad 2, a gate pad 4 etc. are formed, whereby the semiconductor device 73 shown in FIG. 15B is obtained.

In the semiconductor device 73, annular channels are formed in peripheral edge portions of the body regions 12 of each unit cell by applying drain voltage between the source pad 2 (the source electrode 27) and the drain electrode 30 (between a source and a drain) and applying prescribed voltage (voltage of not less than gate threshold voltage) to the gate pad 4 (the gate electrode 20) in a state grounding the source pad 2 (i.e., the source electrode 27 is at 0 V), similarly to the first embodiment. Thus, current flows from the drain electrode 30 to the source electrode 27, and each unit cell enters an ON-state.

When each unit cell is brought into an OFF-state (i.e., a state where gate voltage is 0 V) and the voltage is kept being applied between the source and the drain, on the other hand, an electric field is applied to the gate insulating film 19 interposed between the gate electrode 20 and the epitaxial layer 8. The electric field results from potential difference between the gate electrode 20 and the epitaxial layer 8. In the interbody regions 16 where the conductivity type ($n^-$-type) of a drift region 13 is maintained, equipotential surfaces of extremely high potential with reference (0 V) to the gate electrode 20 are distributed and the intervals between the equipotential surfaces are small, whereby an extremely large electric field is generated. If the drain voltage is 900 V, for example, equipotential surfaces of 900 V are distributed around a back surface 7 of an SiC substrate 5 in contact with the drain electrode 30 and a voltage drop is caused from the back surface 7 of the Si substrate 5 toward the surface 9 of the epitaxial layer 8, while equipotential surfaces of about several 10 V are distributed in the interbody regions 16. Therefore, a large electric field directed toward the gate electrode 20 is generated in the interbody regions 16.

In the semiconductor device 73, however, the through-holes 74 are formed in portions of the gate electrode 20 opposed to the respective intersectional regions 18 where a particularly strong electric field is easily generated, and part (embedded portion 75) of the interlayer dielectric film 25 enters each through-hole 74. Therefore, it follows that portions of the gate insulating film 19 opposed to the interbody regions 16 are interposed between the epitaxial layer 8 and the insulating embedded portions 75. Even if an electric field results from the potential difference between the gate electrode 20 and the epitaxial layer 8, therefore, the electric field can be rendered hardly applicable to the portions of the gate insulating film 19 opposed to the interbody regions 16. Consequently, a total electric field applied to the portions of the gate insulating film 19 opposed to the interbody regions 16 can be relaxed. Therefore, dielectric breakdown of the gate insulating film 19 can be suppressed in an HTRB test in which voltage approximate to the withstand voltage of the device is continuously applied between the source and the drain and further in practical use. Therefore, the semiconductor device 73 excellent in withstand voltage can be manufactured with a high yield.

Modifications of Third Embodiment

While a plurality of modifications of the semiconductor device 73 according to the third embodiment are now illustrated, modifications are not restricted to these.

For example, the through-holes 74 may be formed in portions opposed to line regions. Further, the through-holes 74 may not necessarily be square-shaped, but may be triangular, circular or the like.

Figure 17:
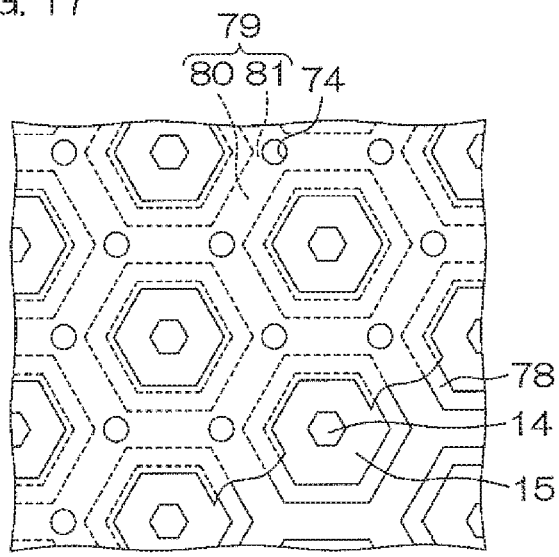
FIG. 17 is a schematic plan view for illustrating a first modification of the semiconductor device according to the third embodiment.

In the semiconductor device 73, the plane shape of the body regions 12 may not be square, but may be in the form of a regular hexagon, as in body regions 78 shown in FIG. 17, for example.

The array pattern of the body regions 78 in this case is such a honeycomb pattern that the body regions 78 are so arrayed that single sides of adjacent body regions 78 are parallel to one another, for example.

Regions (interbody regions 79) between the respective ones of the body regions 78 arrayed in the honeycomb pattern are in the form of a honeycomb having a constant width. Each interbody region 79 includes a line region 80 linearly extending between the respective ones of the adjacent body regions 78 along six side surfaces of each body region 78 and an intersectional region 81 where three line regions 80 radially intersect with one another.

In this case, through-holes 74 can be formed in portions of a gate electrode 20 opposed to the intersectional regions 81 of the honeycomb interbody regions 79, for example.

Figure 18:
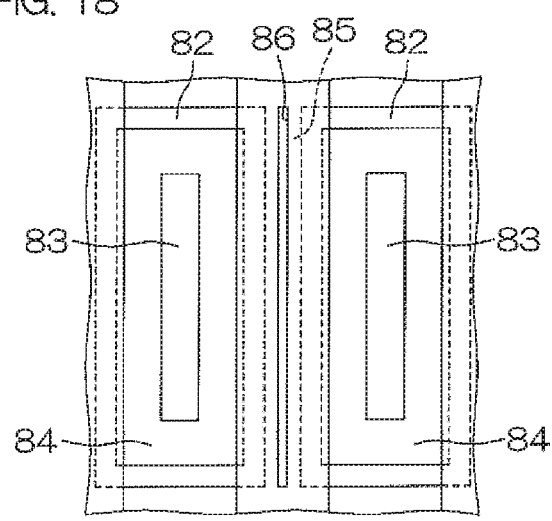
FIG. 18 is a schematic plan view for illustrating a second modification of the semiconductor device according to the third embodiment.

The plane shape of body regions 82 may be in the form of an elongational oblong, as in the body regions 82 shown in FIG. 18, for example.

The oblong body regions 82 are arrayed at a constant pitch so that the long sides of body regions 82 adjacent to one another are parallel to one another, for example. In a surface layer portion of each body region 82, a body contact region 83 is formed on a central portion thereof, and a source region 84 is formed to surround the body contact region 83. The body contact region 83 is in the form of an oblong similar to the body region 82 in plan view. On the other hand, the source region 84 is in the form of a rectangular ring in plan view.

Regions (interbody regions 85) between the respective ones of the body regions 82 arrayed in this manner are in the form of lines linearly extending between the respective ones along the longitudinal direction of the body regions 82.

In this case, through-holes 74 are formed in the form of grooves (through-grooves 86) linearly extending along the interbody regions 85, by removing portions of a gate electrode 20 opposed to the interbody regions 85, for example.

Fourth Embodiment: Field Relaxation Employing High-k Film

Figure 19:
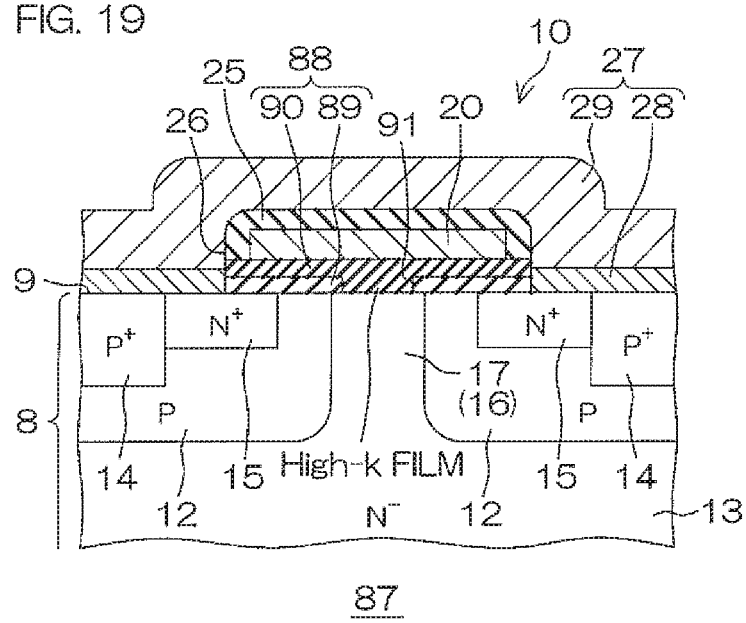
FIG. 19 is an enlarged sectional view of a principal portion of a semiconductor device according to a fourth embodiment of the present invention.

FIG. 19 is an enlarged sectional view of a principal portion of a semiconductor device according to a fourth embodiment of the present invention, and shows a section corresponding to FIG. 2A. Referring to FIG. 19, portions corresponding to the respective portions shown in the aforementioned FIG. 1 and the like are denoted by the same reference signs.

In a semiconductor device 87 according to the fourth embodiment, a High-k (high dielectric constant) material is employed for a portion of a gate insulating film 88 opposed to an interbody region 16. The High-k material is an insulating material whose dielectric constant is higher than that of $SiO_2$, and $HfO_2$ (hafnium oxide), $ZrO_2$ (zirconium oxide), HfSiO (hafnium silicate), SiON, SiN, $Al_2O_3$ or AlON can be listed, for example.

The gate insulating film 88 has an $SiO_2$ film 89 as a low dielectric constant portion whose dielectric constant is relatively low and a High-k film 90 as a high dielectric constant portion whose dielectric constant is relatively high.

Referring to FIG. 19, the $SiO_2$ film 89 is formed on a surface 9 of an epitaxial layer 8, has an opening 91 in a portion opposed to the interbody region 16, and is opposed to peripheral edge portions of body regions 12 and outer peripheral edges of source regions 15.

The High-k film 90 is stacked on the $SiO_2$ film 89, and part thereof fills up the opening 91 of the $SiO_2$ film 89. In other words, the gate insulating film 88 having such a two-layer structure that the $SiO_2$ film 89 and the High-k film 90 are successively stacked from the surface 9 of the epitaxial layer 8 is formed in FIG. 19.

The gate insulating film 88 can be formed by thermally oxidizing the surface 9 of the epitaxial layer 8 following the step shown in FIG. 3G thereby forming the $SiO_2$ film 89, then forming the opening 91 in the $SiO_2$ film 89 by etching, and thereafter stacking the High-k material by CVD, for example.

In the semiconductor device 87, a portion of the gate insulating film 88 opposed to the interbody region 16 is the High-k film 90. Thus, dielectric breakdown voltage of the portion (the High-k film 90) in the gate insulating film 88 can be rendered greater than that of the remaining portion (the $SiO_2$ film 89). Even if a large electric field is applied to the High-k film 90, therefore, the High-k film 90 does not dielectrically break down, but can relax the applied electric field therein. Therefore, dielectric breakdown of the gate insulating film 88 can be suppressed in an HTRB test in which voltage approximate to the withstand voltage of the device is continuously applied between a source and a drain and further in practical use. Therefore, the semiconductor device 87 excellent in withstand voltage can be manufactured with a high yield.

Modifications of Fourth Embodiment

While a plurality of modifications of the semiconductor device 87 according to the fourth embodiment are now illustrated, modifications are not restricted to these.

Figure 20:
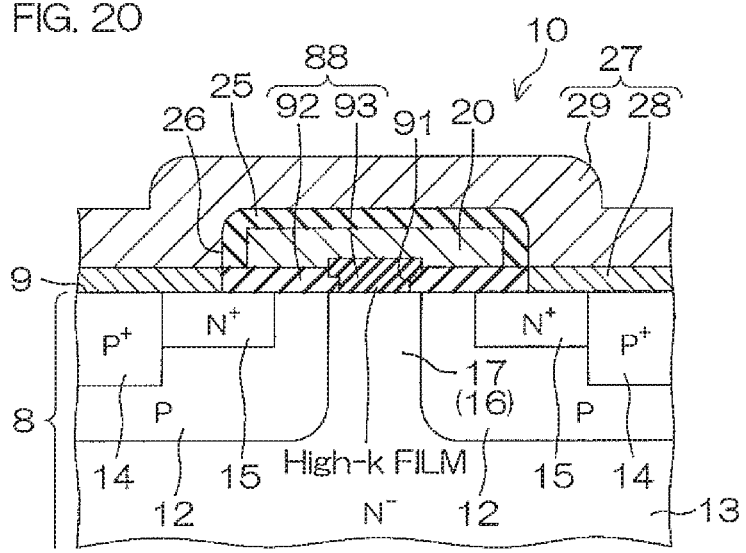
FIG. 20 is a sectional view for illustrating a first modification of the semiconductor device according to the fourth embodiment.

In the semiconductor device 87, a single-layer structure of an $SiO_2$ film 92 may be employed as a substrate of a gate insulating film 88, and a High-k film 93 may not be stacked on the $SiO_2$ film 92 but may simply be embedded in an opening 91 of the $SiO_2$ film 92, as shown in FIG. 20, for example. Thus, it follows that only the $SiO_2$ film 92 is opposed to peripheral edge portions of body regions 12, whereby an electric field generated by applying voltage to a gate electrode 20 in order to form channels in the peripheral edge portions of the body regions 12 can be inhibited from weakening in the gate insulating film 88. Therefore, reduction of a transistor function of the semiconductor device 87 can be suppressed.

Figure 21:
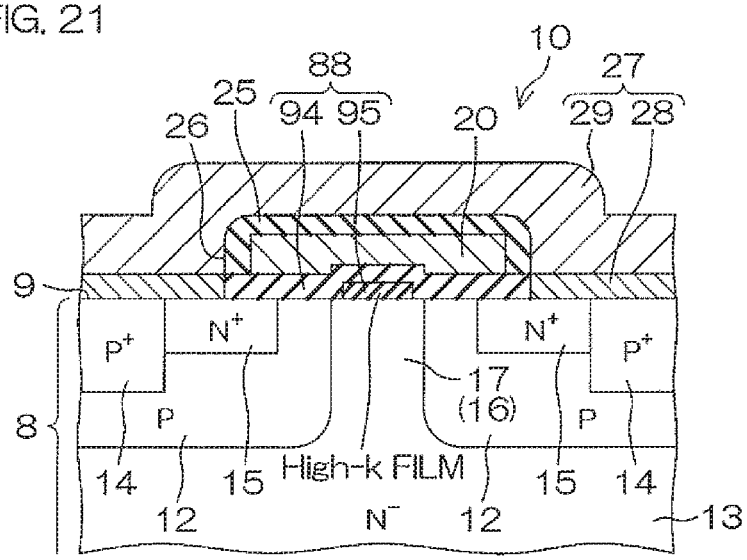
FIG. 21 is a sectional view for illustrating a second modification of the semiconductor device according to the fourth embodiment.

In the semiconductor device 87, the gate insulating film 88 may be in a structure having a High-k film 95 formed on a surface 9 of an interbody region 16 and an $SiO_2$ film 94 stacked on an epitaxial layer 8 to cover the High-k film 95, as shown in FIG. 21.

Fifth Embodiment: Field Relaxation by Enlargement of Interbody Region

Figure 22:
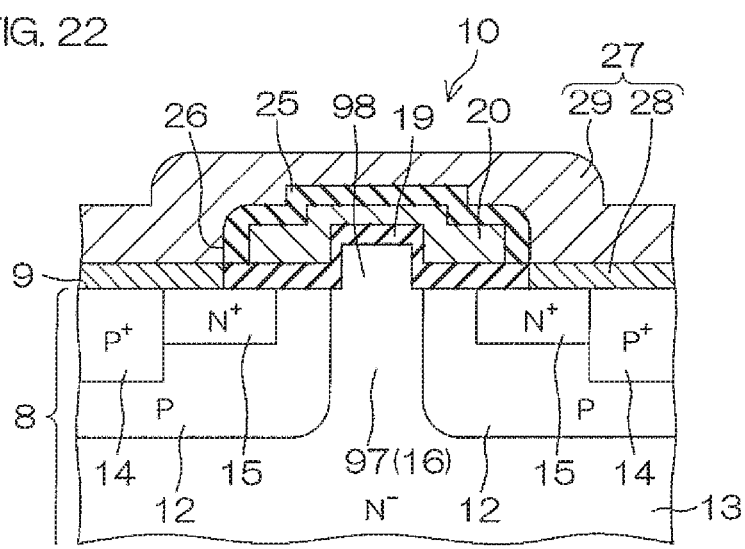
FIG. 22 is an enlarged sectional view of a principal portion of a semiconductor device according to a fifth embodiment of the present invention.

FIG. 22 is an enlarged sectional view of a principal portion of a semiconductor device according to a fifth embodiment of the present invention, and shows a section corresponding to FIG. 2A. Referring to FIG. 22, portions corresponding to the respective portions shown in the aforementioned FIG. 1 and the like are denoted by the same reference signs.

In a semiconductor device 96 according to the fifth embodiment, only an interbody region 97 of an epitaxial layer 8 is enlarged toward the side of a gate insulating film 19.

More specifically, the interbody region 97 has a protrusion 98 projecting from a surface 9 of the epitaxial layer 8 to be raised with respect to the surface 9 of the epitaxial layer 8. As the conductivity type of the protrusion 98, the conductivity type ($n^-$-type) of the epitaxial layer 8 is maintained.

The gate insulating film 19 is formed on the surface 9 of the epitaxial layer 8 to cover the protrusion 98.

The protrusion 98 can be formed by forming the epitaxial layer 8 following the step shown in FIG. 3A, thereafter forming a mask (not shown) covering only a region for forming the protrusion 98, and etching an unnecessary portion (a portion other than the protrusion 98) of the epitaxial layer 8 through the mask, for example.

In the semiconductor device 96, the protrusion 98 is so provided on the interbody region 97 that the distance from a back surface 7 of an SiC substrate 5 up to the gate insulating film 19 lengthens by the quantity of projection of the protrusion 98 in the interbody region 97. Therefore, voltage applied to a drain electrode 30 can be further dropped before the same is applied to the gate insulating film 19 as compared with a case where no protrusion 98 is present. Therefore, voltage of equipotential surfaces distributed immediately under the gate insulating film 19 in the interbody region 97 can be reduced. Consequently, an electric field applied to the gate insulating film 19 can be relaxed.

Modifications of Fifth Embodiment

While a plurality of modifications of the semiconductor device 96 according to the fifth embodiment are now illustrated, modifications are not restricted to these.

Figure 23:
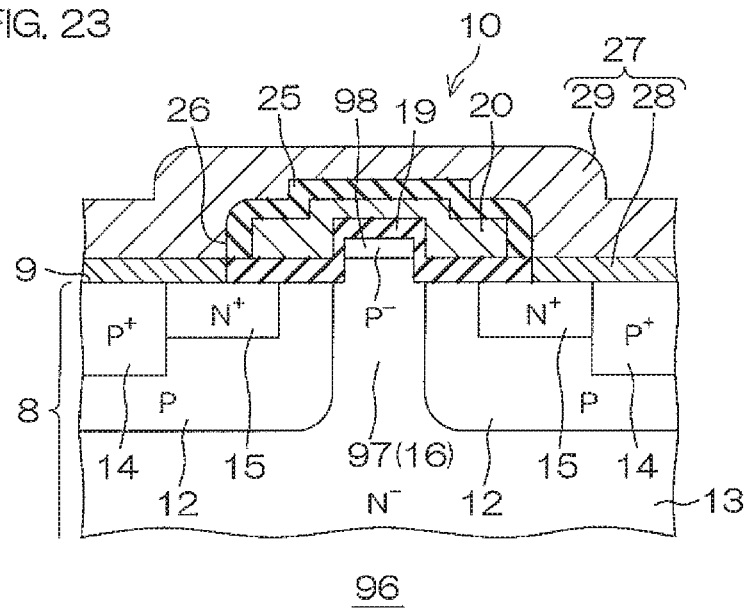
FIG. 23 is a sectional view for illustrating a first modification of the semiconductor device according to the fifth embodiment.

In the semiconductor device 96, the conductivity type of the epitaxial layer 8 may not necessarily be maintained as the conductivity type of the protrusion 98, but a p$^-$-type may be employed, as shown in FIG. 23, for example. Thus, a depletion layer resulting from junction (p-n junction) between the protrusion 98 and a drift region 13 can be generated in the interbody region 97. Further, equipotential surfaces of potential with reference to a gate electrode 20 can be lowered toward the side of an SiC substrate 5 and separated from the gate insulating film 19, due to the presence of the depletion layer. Consequently, the electric field applied to the gate insulating film 19 can be further reduced.

In order to form the p$^-$-type protrusion 98, the protrusion 98 is formed by first forming the epitaxial layer 8 following the step shown in FIG. 3A, thereafter forming a mask (not shown) covering only a region for forming the protrusion 98 and etching an unnecessary portion (a portion other than the protrusion 98) of the epitaxial layer 8 through the mask, for example. The p$^-$-type protrusion 98 can be formed by forming a sidewall on the protrusion 98 after the formation of the protrusion 98 and thereafter implanting a p-type impurity also into the protrusion 98 in the step shown in FIG. 3B.

In the semiconductor device 96, a gate insulating film may have an SiO$_2$ film and a High-k film, similarly to the fourth embodiment.

Figure 24:
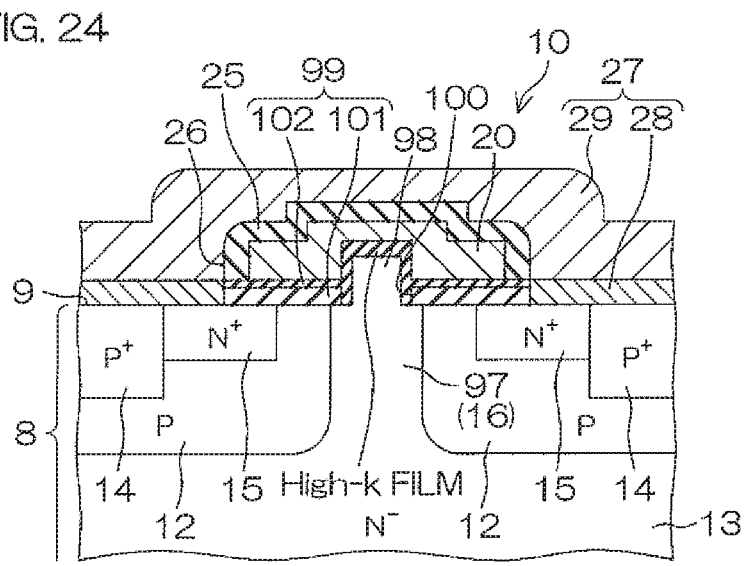
FIG. 24 is a sectional view for illustrating a second modification of the semiconductor device according to the fifth embodiment.

For example, a gate insulating film 99 may have an SiO$_2$ film 101 formed on a surface 9 of an epitaxial layer 8, having an opening 100 exposing a protrusion 98 and opposed to peripheral edge portions of body regions 12 and outer peripheral edges of source regions 15 and a High-k film 102 stacked on the SiO$_2$ film 101 and formed to cover the protrusion 98 exposed from the opening 100 of the SiO$_2$ film 101, as shown in FIG. 24.

Figure 25:
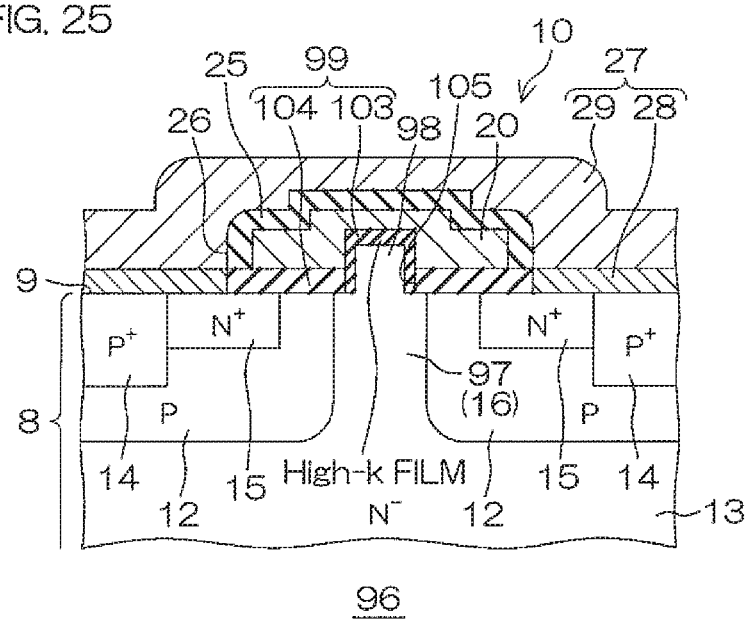
FIG. 25 is a sectional view for illustrating a third modification of the semiconductor device according to the fifth embodiment.

Further, a High-k film 103 may not be stacked on an SiO$_2$ film 104, but may be formed to cover a protrusion 98 exposed from an opening 105 of the SiO$_2$ film 104, as shown in FIG. 25.

Figure 26:
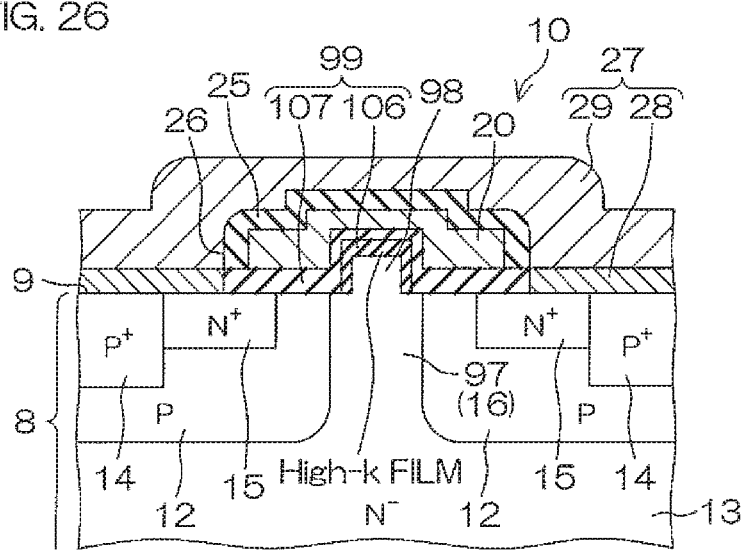
FIG. 26 is a sectional view for illustrating a fourth modification of the semiconductor device according to the fifth embodiment.

In addition, a gate insulating film 99 may be in a structure having a High-k film 106 formed to cover a protrusion 98 and an SiO$_2$ film 107 stacked on an epitaxial layer 8 to cover the High-k film 106, as shown in FIG. 26.

In the modes shown in FIGS. 24 to 26, portions of the gate insulating films 99 opposed to the protrusions 98 are the High-k films 102, 103 and 106. Thus, dielectric breakdown voltage of these portions (the High-k films 102, 103 and 106) in the gate insulating films 99 can be rendered greater than that of the remaining portions (the SiO$_2$ films). Therefore, electric fields applied to the gate insulating films 99 can be further relaxed.

While the embodiments of the present invention have been described, the present invention may be embodied in other ways.

For example, a structure inverting the conductivity type of each semiconductor portion of each of the aforementioned semiconductor devices (1, 66, 73, 87 and 96) may be employed. In the semiconductor device 1, for example, the p-type portions may be of the n-type, and the n-type portions may be of the p-type.

While only the semiconductor devices employing SiC have been employed as examples of the present invention in the aforementioned embodiments, the present invention is also applicable to a power semiconductor device employing Si, for example.

Figure 27B:
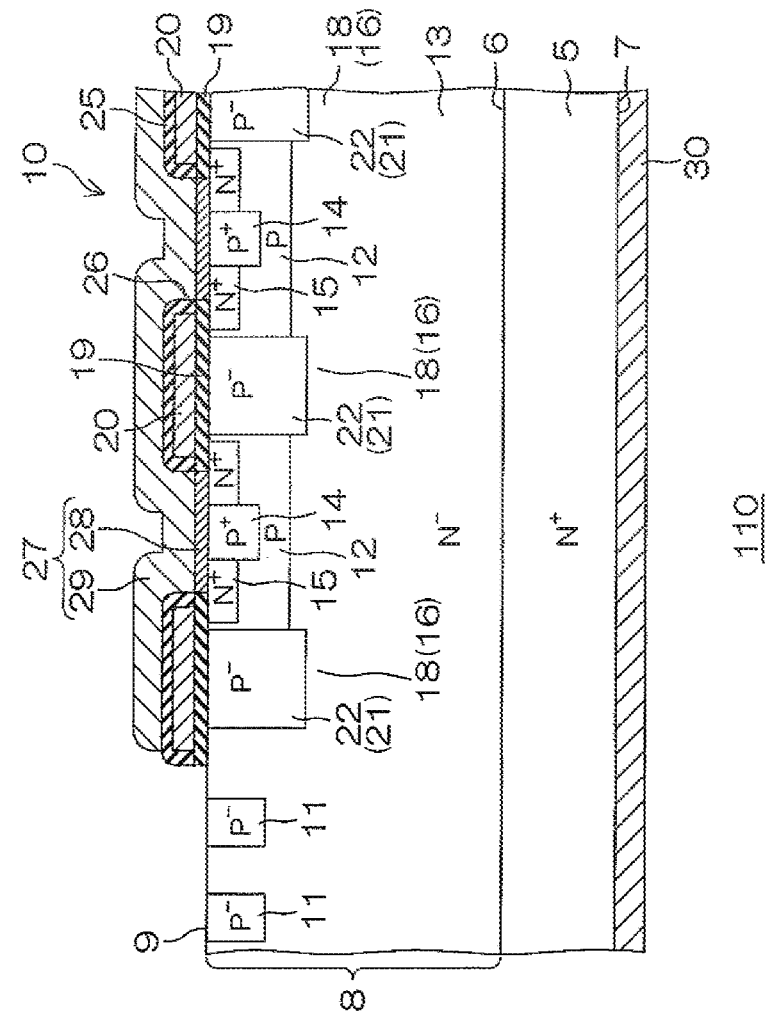
FIG. 27A and FIG. 27B is a schematic plan view for illustrating an eighth modification of the semiconductor device according to the first embodiment.
Figure 27A:
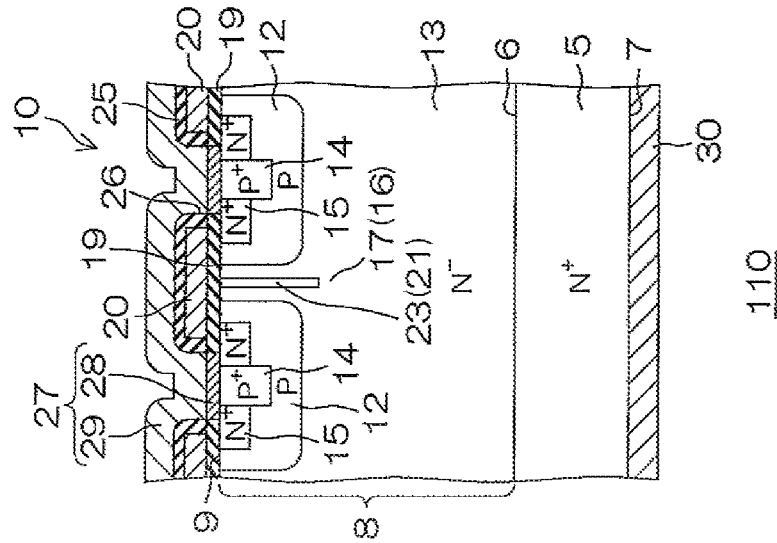

The implantation region 21 in the first embodiment may be deeper than body regions 12, as shown in a semiconductor device 110 of FIG. 27, for example.

The components shown in the respective embodiments of the present invention can be combined with one another within the scope of the present invention.

Figure 28A:
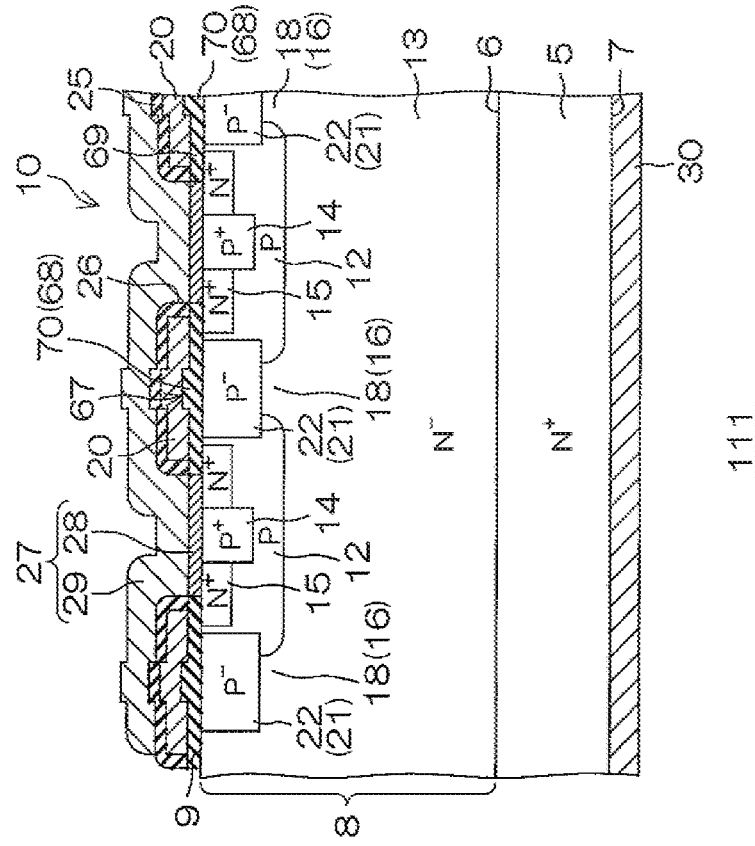
FIG. 28A and FIG. 28B are schematic sectional views of a semiconductor device according to a sixth embodiment of the present invention.
Figure 28B:
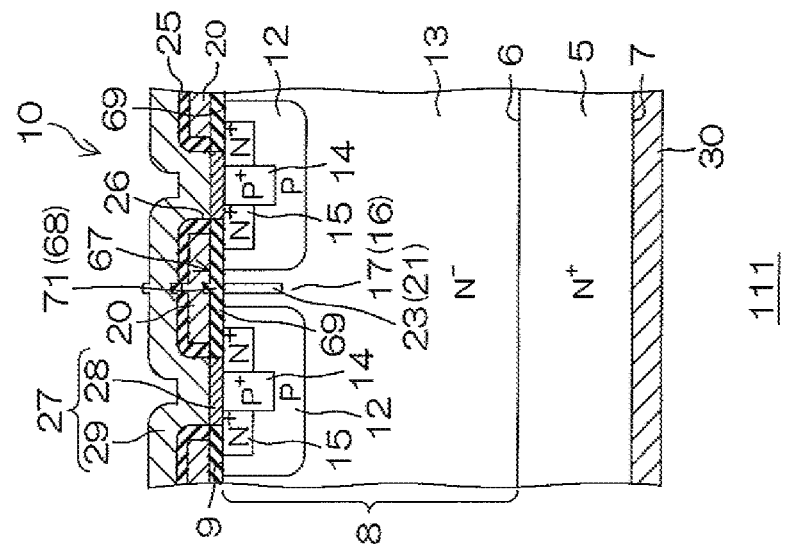

For example, a semiconductor device 111 shown in FIG. 28 can be prepared by combining the components of the semiconductor device 1 according to the first embodiment shown in FIGS. 2A and 2B and the components of the semiconductor device 66 according to the second embodiment shown in FIGS. 12A and 12B with one another. Referring to FIG. 28, portions corresponding to the respective portions shown in FIGS. 2A and 2B, FIGS. 12A and 12B etc. are denoted by the same reference signs.

Figure 29B:
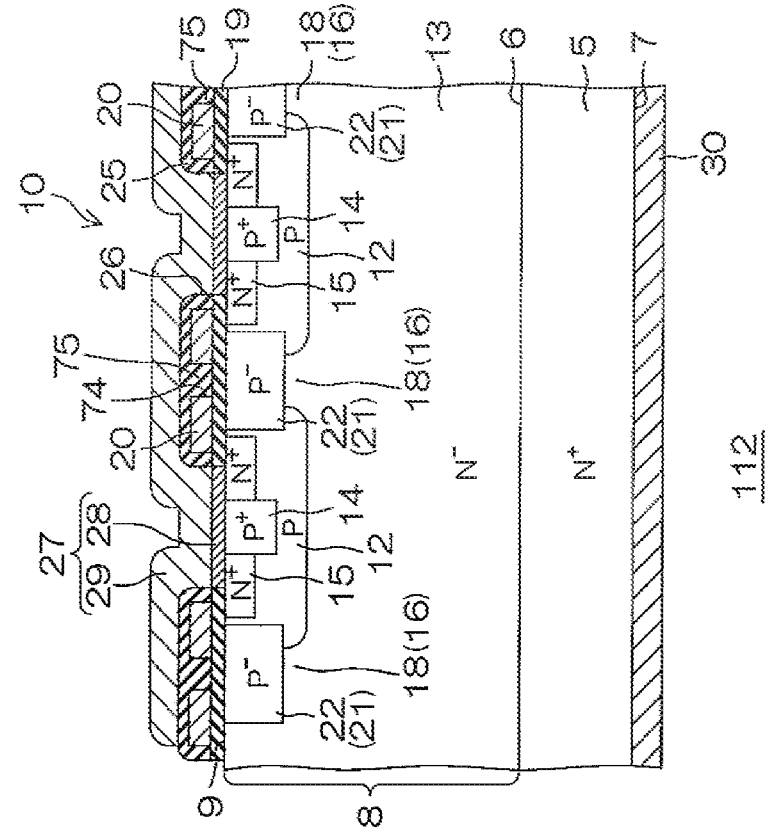
FIG. 29A and FIG. 29B are schematic sectional views of a semiconductor device according to a seventh embodiment of the present invention.
Figure 29A:
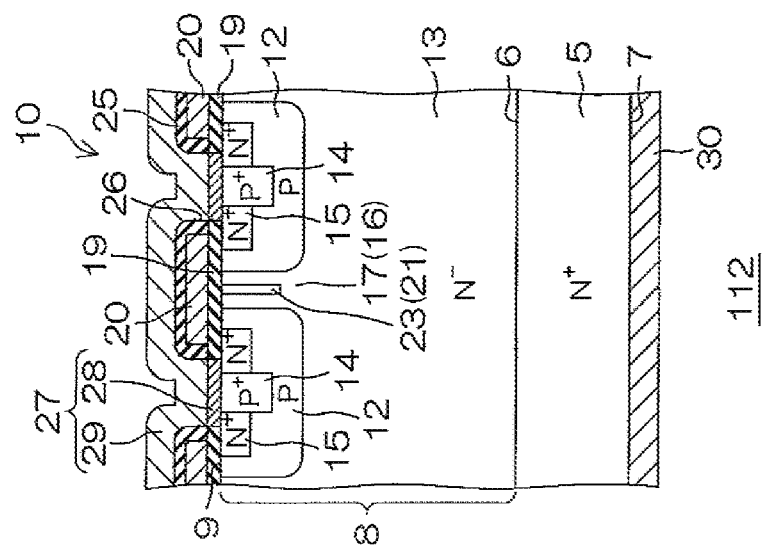

A semiconductor device 112 shown in FIG. 29 can be prepared by combining the components of the semiconductor device 1 according to the first embodiment shown in FIGS. 2A and 2B and the components of the semiconductor device 73 according to the third embodiment shown in FIGS. 15A and 15B with one another. Referring to FIG. 29, portions corresponding to the respective portions shown in FIGS. 2A and 2B, FIGS. 15A and 15B etc. are denoted by the same reference signs.

A semiconductor device 113 shown in FIG. 30 can be prepared by combining the components of the semiconductor device 1 according to the first embodiment shown in FIGS. 2A and 2B and the components of the semiconductor device 87 according to the fourth embodiment shown in FIG. 19 with one another. Referring to FIG. 30, portions corresponding to the respective portions shown in FIGS. 2A and 2B, FIG. 19 etc. are denoted by the same reference signs.

The semiconductor device according to the present invention can be built into a power module employed for an inverter circuit constituting a driving circuit for driving an electric motor utilized as a power source for an electric automobile (including a hybrid car), a train, an industrial robot or the like, for example. Further, the same can also be built into a power module employed for an inverter circuit converting power generated by a solar cell, a wind turbine generator or still another power generator (particularly a private power generator) to match with power of a commercial power supply.

The embodiments of the present invention are merely illustrative of the technical principles of the present invention but not limitative of the invention, and the spirit and scope of the present invention are to be limited only by the appended claims.

The components shown in the respective embodiments of the present invention can be combined with one another within the scope of the present invention.

Example

While the present invention is now described with reference to Example and comparative example, the present invention is not limited by the following Example.

Example 1 and Comparative Example 1

22 semiconductor devices 1 in total each having the structure shown in FIG. 1 were prepared following the steps shown in FIGS. 3A to 3K (Example 1). 22 semiconductor devices in total were prepared by a method similar to that for Example 1, except that no implantation regions were formed.

<HTRB Test>

An HTRB test was conducted on the 22 semiconductor devices and the 22 semiconductor devices obtained according to Example 1 and comparative example 1 respectively. Conditions of the HTRB test were set identical (150° C./150 hours/600 V bias) as to all semiconductor devices.

Consequently, a gate insulating film dielectrically broke down in zero out of the 22 semiconductor devices according to Example 1 in which implantation regions were formed, dielectric breakdown of gate insulating films was caused in 17 out of the 22 semiconductor devices according to comparative example 1.

DESCRIPTION OF THE REFERENCE NUMERALS

1 . . . semiconductor device, 8 . . . epitaxial layer, 12 . . . body region, 15 . . . source region, 16 . . . interbody region, 17 . . . line region, 18 . . . intersectional region, 19 . . . gate insulating film, 20 . . . gate electrode, 21 . . . implantation region, 22 . . . intersectional portion, 23 . . . linear portion, 24 . . . straight line, 36 . . . implantation region, 37 . . . intersectional portion, 38 . . . linear portion, 39 . . . body region, 40 . . . interbody region, 41 . . . line region, 42 . . . intersectional region, 43 . . . implantation region, 44 . . . intersectional portion, 45 . . . linear portion, 46 . . . body region, 47 . . . interbody region, 48 . . . first line region, 49 . . . second line region, 50 . . . intersectional region, 51 . . . implantation region, 52 . . . intersectional portion, 53 . . . linear portion, 54 . . . straight line, 55 . . . body region, 57 . . . source region, 59 . . . implantation region, 60 . . . end portion, 61 . . . linear portion, 62 . . . body region, 64 . . . body region, 66 . . . semiconductor device, 67 . . . gate insulating film, 68 . . . thick-film portion, 69 . . . thin-film portion, 70 . . . intersectional portion, 71 . . . linear portion, 73 . . . semiconductor device, 74 . . . through-hole, 75 . . . embedded portion, 78 . . . body region, 79 . . . interbody region, 80 . . . line region, 81 . . . intersectional region, 82 . . . body region, 84 . . . source region, 85 interbody region, 86 . . . through-groove, 87 . . . semiconductor device, 88 . . . gate insulating film, 89 . . . SiO$_2$ film, 90 . . . High-k film, 92 . . . SiO$_2$ film, 93 . . . High-k film, 94 . . . SiO$_2$ film, 95 . . . High-k film, 96 . . . semiconductor device, 97 . . . interbody region, 99 . . . gate insulating film, 101 . . . SiO$_2$ film, 102 . . . High-k film, 103 . . . High-k film, 104 . . . SiO$_2$ film, 106 . . . High-k film, 107 . . . SiO$_2$ film, 110 . . . semiconductor device, 111 . . . semiconductor device, 112 . . . semiconductor device, 113 . . . semiconductor device

What is claimed:

1. A semiconductor device comprising:
   a semiconductor layer of a first conductivity type, the semiconductor layer having a drift region of the first conductivity type;
   body regions of a second conductivity type plurally formed on a surface layer portion of the semiconductor layer at an interval, a part of the drift region being sandwiched between one of the body regions and another body region adjacent to the one of the body regions;
   a source region of the first conductivity type formed on a surface layer portion of each body region;
   a gate insulating film provided on the semiconductor layer to extend between the body regions adjacent to each other, the gate insulating film having a low dielectric constant portion and a high dielectric constant portion, the low dielectric constant portion opposed to a channel region of a part of the body regions and having an opening with a width narrower than a width of the part of the drift region such that a part of the low dielectric constant portion is in contact with the part of the drift region, the high dielectric constant portion being in direct contact with the part of the drift region through the opening and forming a field relaxation portion for relaxing an electric field generated in the gate insulating film, a part of the high dielectric constant portion being disposed so as to overlap the low dielectric constant portion above the channel region in a plan view and extending into the channel region;
   a gate electrode provided on the gate insulating film and opposed to the body regions;
   an insulating film formed over the gate electrode, such that the insulating layer covers a side surface of the gate electrode; and
   a layered structure of the low dielectric constant portion and the high dielectric constant portion, with an edge of the layered structure flush with an exterior surface of the insulating film,
   a source electrode formed over the semiconductor layer and on the insulating film such that the source electrode is in contact with at least a portion of the body regions and at least a portion of the source region, wherein,
   the source electrode is in contact with the edge of the layered structure and each of the low dielectric portion and the high dielectric portion.

2. The semiconductor device according to claim 1, wherein the body regions include first, second and third body regions, the first body region being adjacent the second and third body regions, a first virtual line in between the first and second body regions intersecting a second virtual line in between the first and third body regions, and
   the high dielectric constant portion has an intersection of the first and second virtual lines.

3. The semiconductor device according to claim 1, wherein the high dielectric constant portion has a linear shape in between two adjacent body regions.

4. The semiconductor device according to claim 1, wherein the plane area of the field relaxation portion is smaller than the plane area of the body regions.

5. The semiconductor device according to claim 1, wherein
   the high dielectric constant portion is made of a high dielectric constant film including at least one selected from the group consisting of HfO2, ZrO$_2$, HfSiO, SiON, SiN, Al$_2$O$_3$ and AlON, and
   the low dielectric constant portion is made of an SiO$_2$ film.

6. The semiconductor device according to claim 1, wherein the semiconductor layer has a dielectric breakdown field of not less than 1 MV/cm.

7. The semiconductor device according to claim 6, wherein the semiconductor layer is made of SiC.

8. The semiconductor device according to claim 1, wherein the body regions are in the form of regular polygons in the plan view.

9. The semiconductor device according to claim 8, wherein the body regions are in the form of squares in the plan view.

10. The semiconductor device according to claim 1, wherein the gate insulating film is in contact with the body region at the low dielectric constant portion and is in contact with the portion of the semiconductor layer located between the body regions at the high dielectric constant portion.

11. The semiconductor device according to claim 1, wherein the high dielectric constant portion has a T-shaped cross section.

* * * * *